United States Patent
Cheon et al.

(10) Patent No.: US 12,547,078 B2
(45) Date of Patent: Feb. 10, 2026

(54) EXPOSURE MASK AND METHOD OF MANUFACTURING DISPLAY DEVICE USING THE SAME

(71) Applicant: Samsung Display Co., LTD., Yongin-si (KR)

(72) Inventors: Soohong Cheon, Seoul (KR); Hyungjin Song, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 284 days.

(21) Appl. No.: 18/116,449

(22) Filed: Mar. 2, 2023

(65) Prior Publication Data
US 2023/0393482 A1    Dec. 7, 2023

(30) Foreign Application Priority Data
Jun. 2, 2022    (KR) .................. 10-2022-0067741

(51) Int. Cl.
*G03F 1/44*    (2012.01)
*G03F 1/42*    (2012.01)
*G03F 7/00*    (2006.01)
*G03F 7/20*    (2006.01)

(52) U.S. Cl.
CPC ........ *G03F 7/2063* (2013.01); *G03F 7/70475* (2013.01); *G03F 7/7065* (2013.01)

(58) Field of Classification Search
CPC .. G03F 7/2063; G03F 7/70475; G03F 7/7065; G03F 1/00; G03F 1/42; G03F 7/70791; G03F 9/7076; G03F 1/44; G03F 1/50; G02F 1/1303; H10K 59/124; H10K 71/00
See application file for complete search history.

(56) References Cited

U.S. PATENT DOCUMENTS

2008/0164524 A1\*  7/2008  Kawano ............. H10D 86/0231
                                                    430/5
2018/0061709 A1\*  3/2018  Pai ....................... H10F 39/8053

FOREIGN PATENT DOCUMENTS

| KR | 0163937 | 1/1999 | |
|---|---|---|---|
| KR | 10-2007-0005499 | 1/2007 | |
| KR | 10-2017-0121749 | 11/2017 | |
| KR | 10-2198599 | 1/2021 | |
| WO | WO-2020088082 A1 \* | 5/2020 | ......... H10D 86/0212 |

\* cited by examiner

*Primary Examiner* — Nghia M Doan
(74) *Attorney, Agent, or Firm* — Sughrue Mion, PLLC

(57) ABSTRACT

An exposure mask includes a base layer including a first area and a second area spaced apart from a first area in a first direction, a first inspection transmission pattern defined in a first area of a base layer and arranged in a ring shape having at least one connection part in plan view, and a second inspection transmission pattern defined in a second area of a base layer and arranged in a polygonal shape or a circular shape in plan view.

10 Claims, 28 Drawing Sheets

FIG. 7
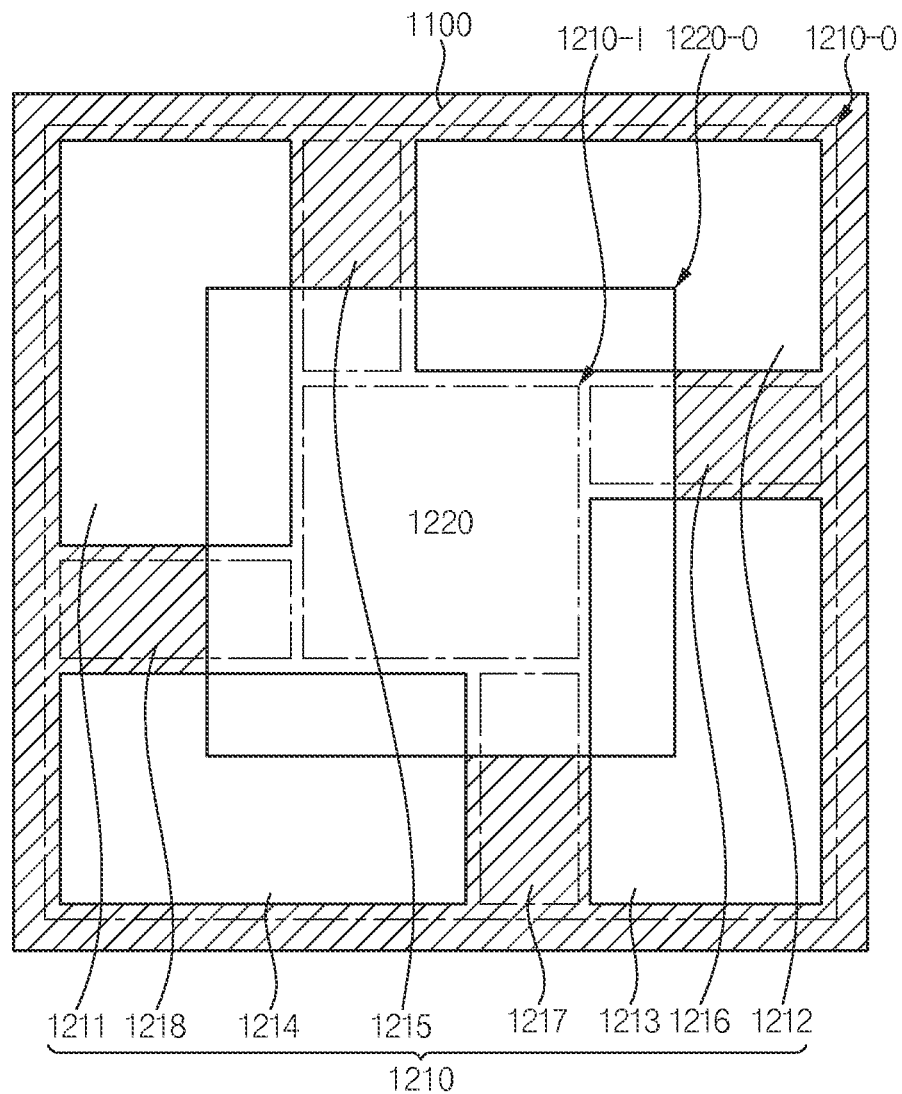
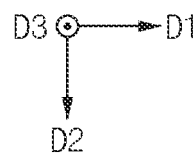

FIG. 15
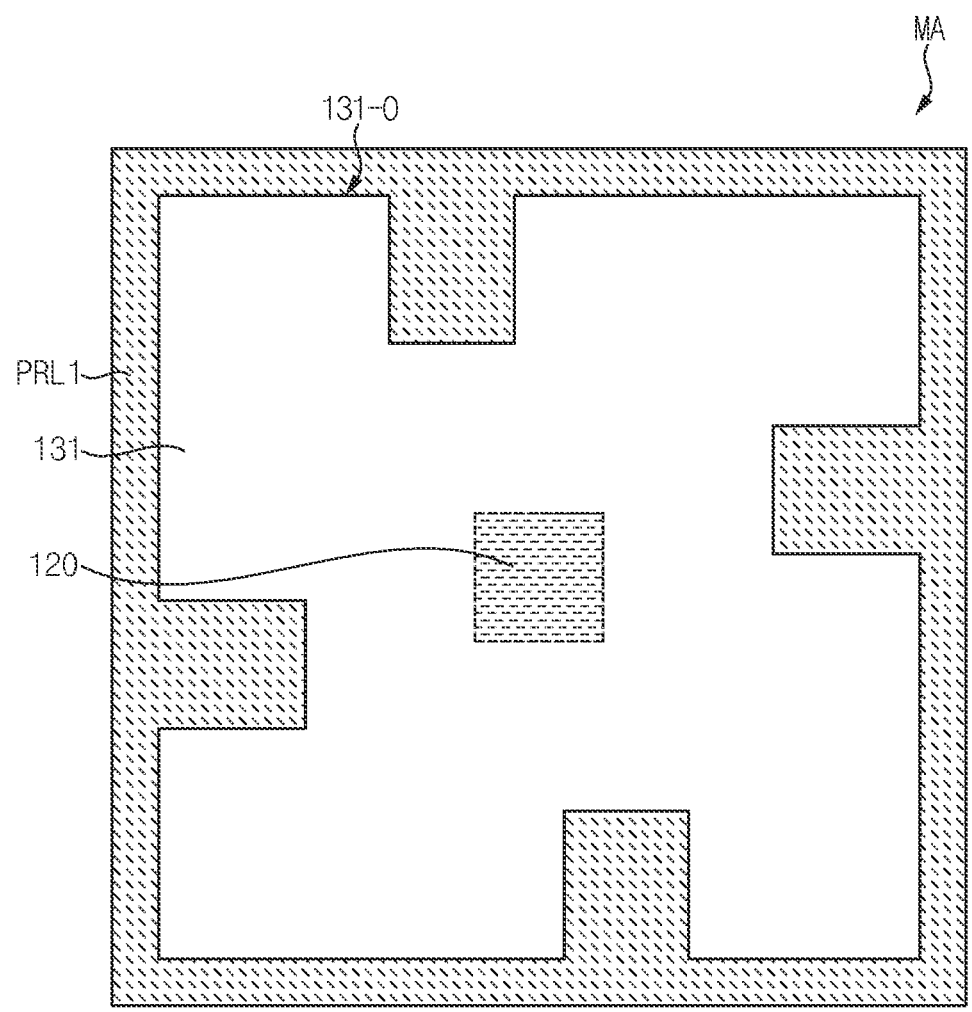
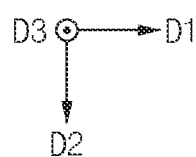

FIG. 16
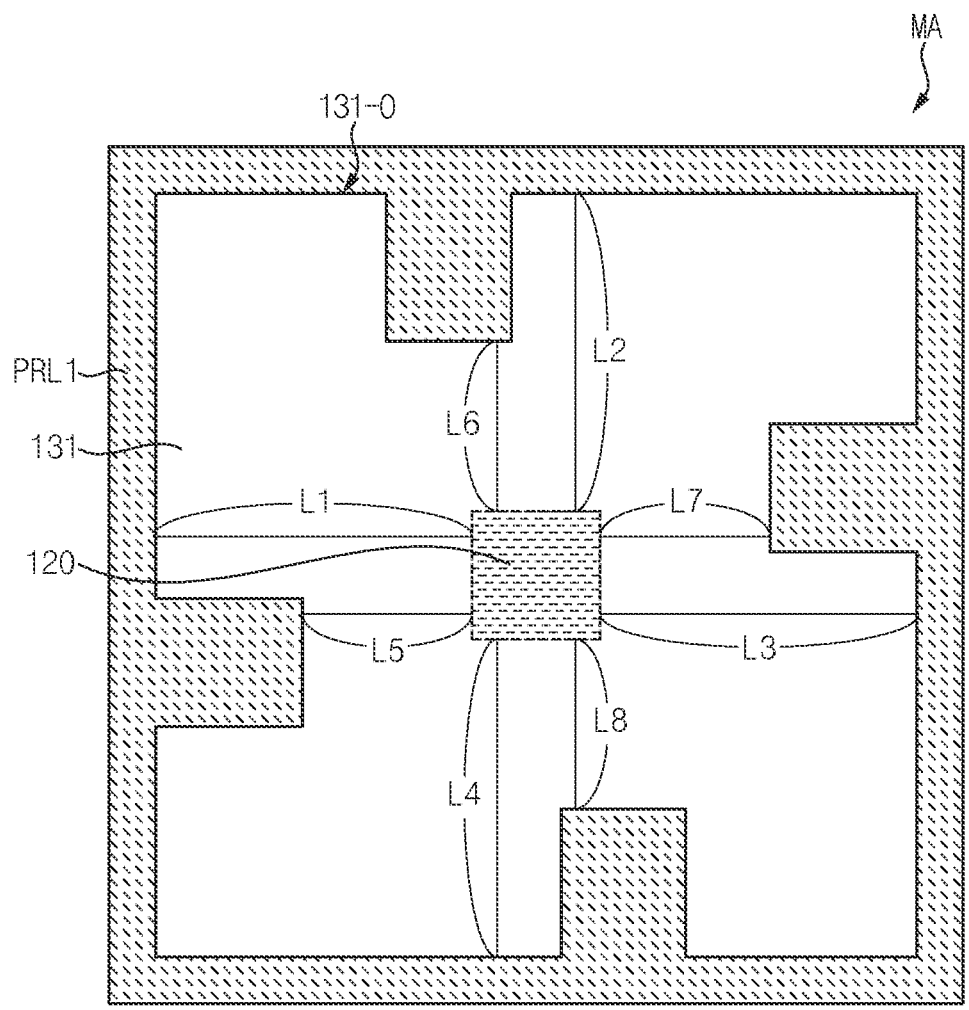
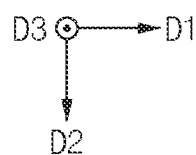

EXPOSURE MASK AND METHOD OF MANUFACTURING DISPLAY DEVICE USING THE SAME

CROSS-REFERENCE TO RELATED APPLICATION(S)

This application claims priority to and benefits of Korean Patent Application No. 10-2022-0067741 under 35 U.S.C. § 119, filed on Jun. 2, 2022 in the Korean Intellectual Property Office, the entire contents of which are herein incorporated by reference.

BACKGROUND

1. Technical Field

Embodiments of the disclosure relate to an exposure mask and method of manufacturing display device using the exposure mask.

2. Description of the Related Art

Recently, as display devices have increased in size, a method of dividing and exposing a substrate divided into multiple shot areas while moving an exposure mask is used in the manufacturing process of the display device. In this case, an alignment error including shift, rotation, and distortion may occur at the boundary between the shot areas. In case that the alignment error occurs, electrical characteristics of the display device may be deteriorated, and stains may be recognized and display quality may be deteriorated.

SUMMARY

Embodiments provide an exposure mask capable of improving display quality of a display device.

Embodiments provide a method of manufacturing the display device using the exposure mask.

An exposure mask according to an embodiment may include a base layer including a first area and a second area spaced apart from the first area in a first direction, a first inspection transmission pattern defined in the first area of the base layer and arranged in a ring shape having at least one connection part in plan view, and a second inspection transmission pattern defined in the second area of the base layer and arranged in a polygonal shape or a circular shape in plan view.

In an embodiment, the first inspection transmission pattern may include a first transmission part, a second transmission part spaced apart from the first transmission part in the first direction, and a first connection part defined between the first transmission part and the second transmission part.

In an embodiment, the first inspection transmission pattern may further include a third transmission part spaced apart from the second transmission part in a second direction perpendicular to the first direction, and a second connection part defined between the second transmission part and the third transmission part.

In an embodiment, the first inspection transmission pattern may further include a fourth transmission part spaced apart from the third transmission part in a direction opposite to the first direction and spaced apart from the first transmission part in the second direction, a third connection part defined between the third transmission part and the fourth transmission part and a fourth connection part defined between the first transmission part and the fourth transmission part.

In an embodiment, the base layer positioned inside of the first inspection transmission pattern may be connected to the base layer positioned outside of the first inspection transmission pattern by the first to fourth connection parts.

In an embodiment, the first inspection transmission pattern may be point-symmetric with respect to a central point of the first inspection transmission pattern in plan view.

In an embodiment, the first to fourth transmission parts may be sequentially arranged in a clockwise direction with respect to the central point.

In an embodiment, the first inspection transmission pattern may have a rectangular ring shape, and the second inspection transmission pattern may have a rectangular shape.

In an embodiment, each of the first to fourth transmission parts may have a rectangular shape in plan view.

In an embodiment, the second inspection transmission pattern may have a square shape in plan view.

In an embodiment, in case that the first inspection transmission pattern is moved in the first direction, each of the first to fourth transmission parts may overlap a corner of the second inspection transmission pattern.

A method of manufacturing a display device according to an embodiment may include forming at least one reference pattern on a substrate including a first shot area and a second shot area adjacent to the first shot area, forming a first material layer on the at least one reference pattern, forming a first photoresist layer on the first material layer, matching an exposure mask on the first shot area of the substrate and exposing the first photoresist layer using the exposure mask, matching the exposure mask on the second shot area of the substrate and exposing the first photoresist layer using the exposure mask, developing the first photoresist layer to form a first inspection resist pattern arranged in a polygonal or a circular shape in which a portion of an outer shape is recessed inward in plan view, and exposing a portion of the first material layer, determining whether the exposure mask has an alignment error from the first inspection resist pattern, and forming a first contact hole in the first material layer using the first photoresist layer as a mask and removing the first photoresist layer to form a first insulating layer in which the first contact hole is defined in case that it is determined that there is no alignment error of the exposure mask.

In an embodiment, the substrate may further include a stitch area in which the first shot area and the second shot area overlap, and the first photoresist layer may be exposed again in the stitch area.

In an embodiment, the first inspection resist pattern may be disposed in the stitch area of the substrate.

In an embodiment, the first inspection resist pattern may overlap the reference pattern in plan view.

In an embodiment, the first inspection resist pattern may be point-symmetric with respect to the reference pattern in plan view.

In an embodiment, the first inspection resist pattern may have a rectangular shape in which a portion of each of the four sides forming the outer shape is recessed inward.

In an embodiment, the method may further include, after the forming of the first insulating layer, forming a second material layer on the first insulating layer, forming a second photoresist layer on the second material layer, matching the exposure mask on the first shot area of the substrate and exposing the second photoresist layer using the exposure mask, matching the exposure mask on the second shot area of the substrate and exposing the second photoresist layer using the exposure mask, developing the second photoresist layer to form a second inspection resist pattern arranged in a same shape as the first inspection resist pattern in plan view and exposing a portion of the second material layer, determining whether the exposure mask has an alignment error from the second inspection resist pattern, and forming a second contact hole in the second material layer using the second photoresist layer as a mask and removing the second photoresist layer to form a second insulating layer in which the second contact hole is defined, in case that it is determined that there is no alignment error of the exposure mask.

In an embodiment, the method may further include, after the forming of the second insulating layer, forming a third material layer on the second insulating layer, forming a third photoresist layer on the third material layer, matching the exposure mask on the first shot area of the substrate and exposing the third photoresist layer using the exposure mask, matching the exposure mask on the second shot area of the substrate and exposing the third photoresist layer using the exposure mask, developing the third photoresist layer to form a third inspection resist pattern arranged in the same shape as the first inspection resist pattern in plan view and exposing a portion of the third material layer, determining whether the exposure mask has an alignment error from the third inspection resist pattern, and forming a third contact hole in the third material layer using the third photoresist layer as a mask and removing the third photoresist layer to form a third insulating layer in which the third contact hole is defined, in case that it is determined that there is no alignment error of the exposure mask.

In an embodiment, the method may further include, after the forming of the third insulating layer, forming a fourth material layer on the third insulating layer, forming a fourth photoresist layer on the fourth material layer, matching the exposure mask on the first shot area of the substrate and exposing the fourth photoresist layer using the exposure mask, matching the exposure mask on the second shot area of the substrate and exposing the fourth photoresist layer using the exposure mask, developing the fourth photoresist layer to form a fourth inspection resist pattern arranged in the same shape as the first inspection resist pattern in plan view and exposing a portion of the fourth material layer, determining whether the exposure mask has an alignment error from the fourth inspection resist pattern, forming a fourth contact hole in the fourth material layer using the fourth photoresist layer as a mask and removing the fourth photoresist layer to form a fourth insulating layer in which the fourth contact hole is defined, in case that it is determined that there is no alignment error of the exposure mask.

Therefore, the exposure mask according to embodiments may include a first inspection transmission pattern and a second inspection transmission pattern. The first inspection transmission pattern may have a ring shape having at least one connection part, and the second inspection transmission pattern may have a polygonal shape or a circular shape. Accordingly, in case that an exposure and development process is repeatedly performed on a substrate while moving the exposure mask, an inspection resist pattern may be defined in the photoresist layer on the substrate. Accordingly, it may be possible to readily determine whether there is an alignment error between the exposure mask from the inspection resist pattern.

According to the exposure mask, even in case that the inspection resist pattern is defined in the photoresist layer, the photoresist layer may have an entirely connected shape. For example, an island pattern of the photoresist layer may not occur. Accordingly, in the process of manufacturing the display device, a process defect due to the island pattern may be prevented.

It is to be understood that both the foregoing general description and the following detailed description are examples and explanatory and are intended to provide further explanation of the disclosure as claimed.

BRIEF DESCRIPTION OF THE DRAWINGS

Illustrative, non-limiting embodiments will be more clearly understood from the following detailed description taken in conjunction with the accompanying drawings.

FIG. 7 is a schematic view illustrating the first area of FIG. 5 and the second area of FIG. 6 overlapping each other.

FIGS. 8 to 20 are schematic views illustrating a method of manufacturing a display device according to an embodiment.

DETAILED DESCRIPTION OF THE EMBODIMENTS

Illustrative, non-limiting embodiments will be more clearly understood from the following detailed description in conjunction with the accompanying drawings.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean any combination including "A, B, or A and B." The terms "and" and "or" may be used in the conjunctive or disjunctive sense and may be understood to be equivalent to "and/or."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
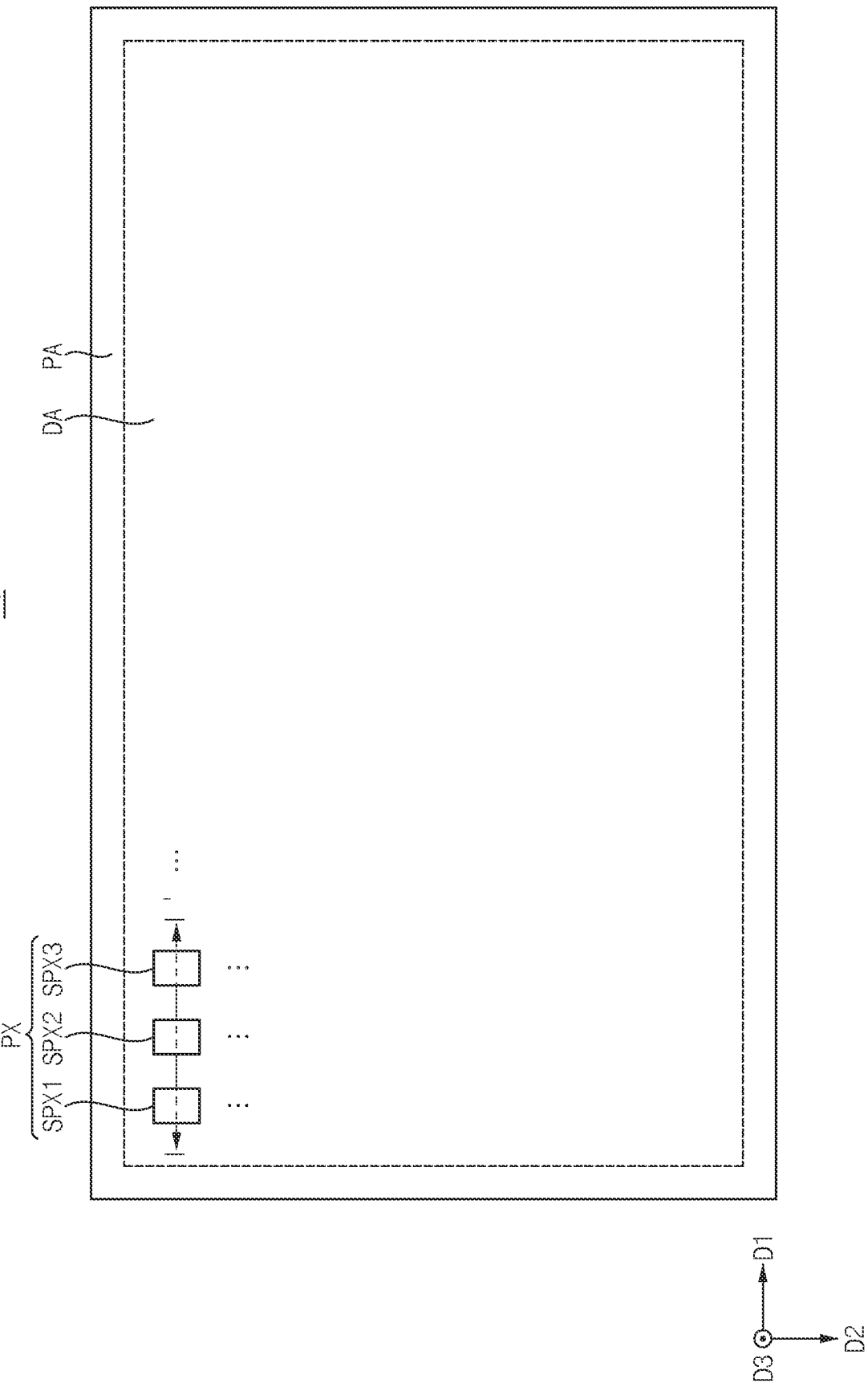
FIG. 1 is a schematic plan view illustrating a display device according to an embodiment.

FIG. 1 is a schematic plan view illustrating a display device according to an embodiment.

Referring to FIG. 1, the display device 10 may be divided into a display area DA and a peripheral area PA. In an embodiment, the peripheral area PA may be positioned around the display area DA. For example, the peripheral area PA may surround the display area DA.

In an embodiment, the display device 10 may have a rectangular shape in plan view. However, the disclosure is not necessarily limited thereto, and the display device 10 may have various shapes in plan view. The plane may be defined from a first direction D1 and a second direction D2 perpendicular to the first direction D1. The third direction D3 may be orthogonal to the plane. The third direction D3 may be referred to as a front direction of the display device 10.

Pixels PX may be disposed in the display area DA. As the pixels PX emit light, the display area DA may display an image.

Each of the pixels PX may include a first sub-pixel SPX1, a second sub-pixel SPX2, and a third sub-pixel SPX3. In an embodiment, the first sub-pixel SPX1 may be a red sub-pixel emitting red light, the second sub-pixel SPX2 may be a green sub-pixel emitting green light, and the third sub-pixel SPX3 may be a blue sub-pixel emitting blue light. However, the color of the light emitted by the first to third sub-pixels SPX1, SPX2, and SPX3 is not limited thereto. Also, although first to third sub-pixels SPX1, SPX2, and SPX3 are illustrated numbering three sub-pixels, the disclosure is not limited thereto. For example, each of the pixels PX may further include a fourth sub-pixel emitting white light.

The display device 10 may include drivers disposed in the peripheral area PA. For example, the drivers may include a gate driver, a data driver, and the like. The drivers may be electrically connected to the pixels PX. The drivers may provide a signal and a voltage for emitting the light to the pixels PX.

Figure 2:
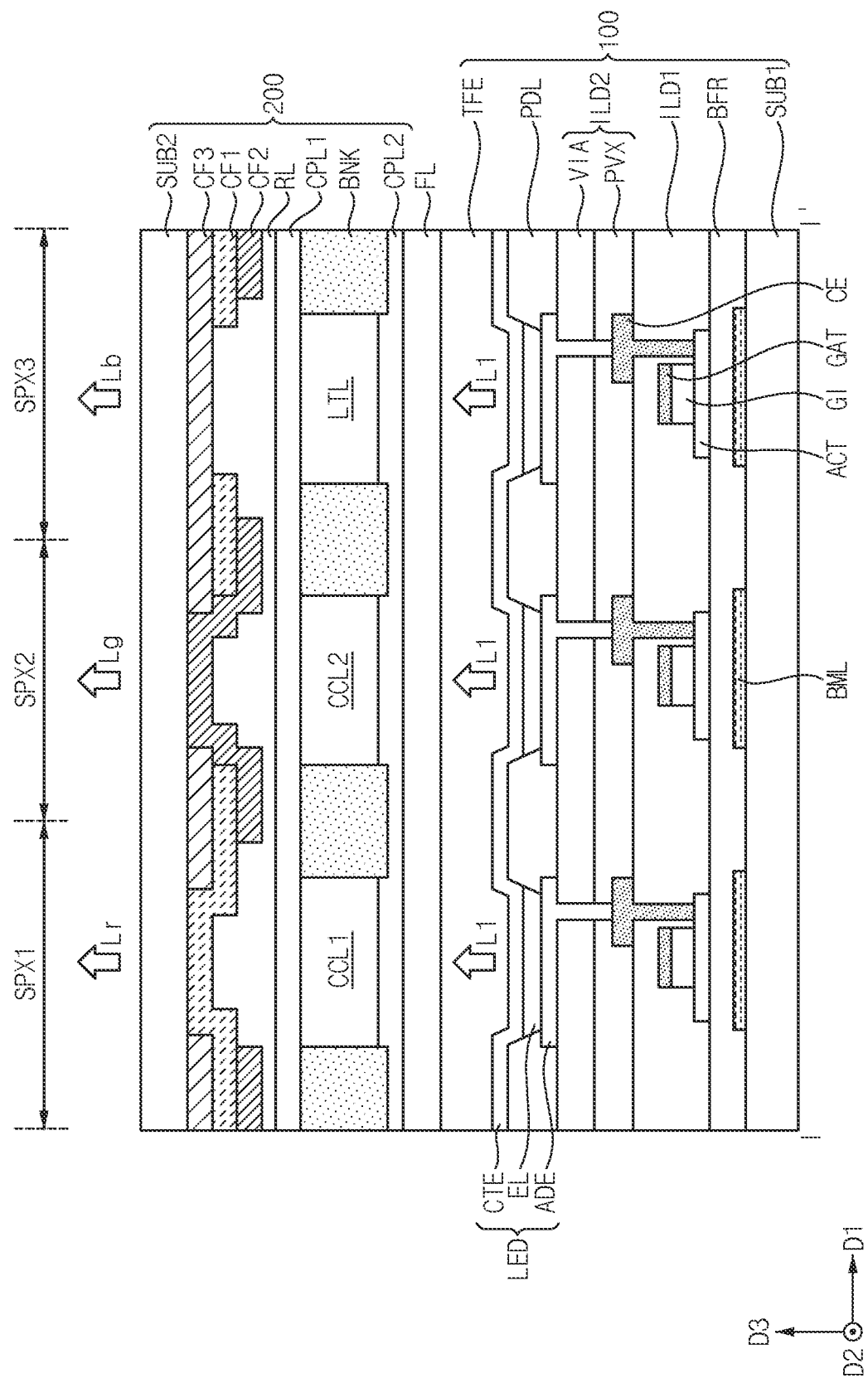
FIG. 2 is a schematic cross-sectional view illustrating an example of the display device of FIG. 1.

FIG. 2 is a schematic cross-sectional view illustrating an example of the display device of FIG. 1. For example, FIG. 2 is a cross-sectional view taken along line I-I' of FIG. 1.

Referring to FIG. 2, the display device 10 may include an array substrate 100, a color conversion substrate 200, and a filling layer FL. In an embodiment, the filling layer FL may be disposed on the array substrate 100, and the color conversion substrate 200 may be disposed on the filling layer FL. For example, the color conversion substrate 200 may face the array substrate 100 and may be positioned in the third direction D3 from the array substrate 100.

The array substrate 100 may include a first substrate SUB1, a buffer layer BFR, a back metal pattern BML, an active pattern ACT, a gate insulating layer GI, a gate electrode GAT, a first interlayer insulating layer ILD1, a connection electrode CE, a second interlayer insulating layer ILD2, an anode electrode ADE, a pixel defining layer PDL, an emission layer EL, a cathode electrode CTE, and an encapsulation layer TFE.

The first substrate SUB1 may include a transparent material or an opaque material. In an embodiment, examples of the material that can be used as the first substrate SUB1 may include glass, quartz, plastic, or the like. These may be used alone or in combination with each other. Also, the first substrate SUB1 may be configured as a single layer or as a multi-layer in combination with each other.

The back metal pattern BML may be disposed on the first substrate SUB1. In an embodiment, the back metal pattern BML may be formed of a metal, an alloy, a conductive metal oxide, a transparent conductive material, or the like. Examples of the material that can be used as the back metal pattern BML may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and the like. These may be used alone or in combination with each other. The back metal pattern BML may be configured as a single layer or as a multilayer in combination with each other.

The buffer layer BFR may be disposed on the first substrate SUB1 and may cover the back metal pattern BML. In an embodiment, the buffer layer BFR may be formed of an inorganic insulating material. Examples of the material that can be used as the inorganic insulating material may include silicon oxide, silicon nitride, silicon oxynitride, and the like. These may be used alone or in combination with each other. The buffer layer BFR may prevent diffusion of metal atoms or impurities from the first substrate SUB1 into the active pattern ACT. The buffer layer BFR may control a heat supply rate during a crystallization process for forming the active pattern ACT.

The active pattern ACT may be disposed on the buffer layer BFR. In an embodiment, the active pattern ACT may be formed of a silicon semiconductor material or an oxide semiconductor material. Examples of the silicon semiconductor material that can be used as the active pattern ACT may include amorphous silicon, polycrystalline silicon, or the like. Examples of the oxide semiconductor material that can be used as the active pattern ACT may include IGZO (InGaZnO), ITZO(InSnZnO), and the like. The oxide semiconductor material may further include indium (In), gallium (Ga), tin (Sn), zirconium (Zr), vanadium (V), hafnium (Hf), cadmium (Cd), germanium (Ge), chromium (Cr), titanium (Ti), and zinc (Zn). These may be used alone or in combination with each other The gate insulating layer GI may be disposed on the active pattern ACT. In an embodiment, the gate insulating layer GI may be formed of an insulating material. Examples of the insulating material that can be used as the gate insulating layer GI may include silicon oxide, silicon nitride, silicon oxynitride, and the like. These may be used alone or in combination with each other.

The gate electrode GAT may be disposed on the gate insulating layer GI. In an embodiment, the gate electrode GAT may be formed of a metal, an alloy, a conductive metal oxide, a transparent conductive material, or the like. Examples of materials that can be used as the gate electrode GAT may include silver (Ag), an alloy containing silver, molybdenum (Mo), an alloy containing molybdenum, aluminum (Al), an alloy containing aluminum, Aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and the like. These may be used alone or in combination with each other.

The first interlayer insulating layer ILD1 may be disposed on the buffer layer BFR and the gate electrode GAT. The first interlayer insulating layer ILD1 may be referred to as a first insulating layer. The first interlayer insulating layer ILD1 may cover the gate electrode GAT. A first contact hole may be defined in the first interlayer insulating layer ILD1. The first contact hole may expose a portion of the active pattern ACT. In an embodiment, the first interlayer insulating layer ILD1 may be formed of an inorganic insulating material. Examples of the inorganic insulating material that can be used as the first interlayer insulating layer ILD1 may include silicon oxide, silicon nitride, silicon oxynitride, and the like. These may be used alone or in combination with each other.

The connection electrode CE may be disposed on the first interlayer insulating layer ILD1. The connection electrode CE may contact the active pattern ACT through the first contact hole. In an embodiment, the connection electrode CE may be formed of a metal, an alloy, a conductive metal oxide, a transparent conductive material, or the like. Examples of materials that can be used as the connecting electrode CE may include silver (Ag), an alloy containing silver, molybdenum (Mo), an alloy containing molybdenum, aluminum (Al), an alloy containing aluminum, Aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and the like. These may be used alone or in combination with each other.

The second interlayer insulating layer ILD2 may be disposed on the first interlayer insulating layer ILD1. The second interlayer insulating layer ILD2 may cover the connection electrode CE. In an embodiment, the second interlayer insulating layer ILD2 may include multiple layers. For example, the second interlayer insulating layer ILD2 may include a passivation layer PVX and a via insulating layer VIA.

The passivation layer PVX may be disposed on the first interlayer insulating layer ILD1. The passivation layer PVX may be referred to as a second insulating layer. The passivation layer PVX may cover the connection electrode CE. A second contact hole may be defined in the passivation layer PVX. The second contact hole may expose a portion of the connection electrode CE. In an embodiment, the passivation layer PVX may be formed of an inorganic insulating material. Examples of the inorganic insulating material that may be used as the passivation layer PVX may include silicon oxide, silicon nitride, silicon oxynitride, and the like. These may be used alone or in combination with each other.

The via insulating layer VIA may be disposed on the passivation layer PVX. The via insulating layer VIA may be referred to as a third insulating layer. A third contact hole may be defined in the via insulating layer VIA. In an embodiment, the third contact hole may be integrated with the second contact hole to expose a portion of the connection electrode CE. In an embodiment, the via insulating layer VIA may be formed of an organic material. Examples of the organic material that can be used as the via insulating layer VIA may include polyacrylic resins, polyimide-based resins, acrylic resins, and the like. These may be used alone or in combination with each other.

The anode electrode ADE may be disposed on the via insulating layer VIA. The anode electrode ADE may contact the connection electrode CE through the second contact hole and the third contact hole. In an embodiment, the anode electrode ADE may be formed of a metal, an alloy, a conductive metal oxide, a transparent conductive material, or the like. Examples of materials that can be used as the anode electrode ADE may include silver (Ag), an alloy containing silver, molybdenum (Mo), an alloy containing molybdenum, aluminum (Al), an alloy containing aluminum, Aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and the like. These may be used alone or in combination with each other. In an embodiment, the anode electrode ADE may be configured as a single layer or as a multilayer in combination with each other.

The pixel defining layer PDL may be disposed on the via insulating layer VIA. The pixel defining layer PDL may be referred to as a fourth insulating layer. A fourth contact hole exposing a portion of the anode electrode ADE may be formed in the pixel defining layer PDL. In an embodiment, the pixel defining layer PDL may be formed of an organic material. Examples of the organic material that can be used as the pixel defining layer PDL may include polyacrylic resin, polyimide resin, acrylic resin, and the like. These may be used alone or in combination with each other.

In an embodiment, the emission layer EL may be disposed on the anode electrode ADE. In an embodiment, the emission layer EL may generate blue light. However, the disclosure is not necessarily limited thereto, and the emission layer EL may generate red light or green light, or may generate lights having different colors according to pixels. In another embodiment, the emission layer EL may be disposed on the anode electrode ADE and the pixel defining layer PDL. For example, the emission layer EL may be entirely formed in the display area DA.

In an embodiment, the emission layer EL may have a multilayer structure in which multiple layers are stacked on each other. For example, in case that the emission layer EL generates blue light, the emission layer EL may have a structure in which multiple blue organic emission layers are stacked on each other. In another embodiment, the emission layer EL may have a multilayer structure in which multiple layers emitting light of different colors are stacked on each other. For example, in case that the emission layer EL generates blue light, the emission layer EL may have a structure in which multiple blue organic emission layers and an organic emission layer emitting light of a color other than blue are stacked on each other.

The cathode electrode CTE may be disposed on the emission layer EL. The emission layer EL may emit light based on a voltage difference between the anode electrode ADE and the cathode electrode CTE. Accordingly, the light emitting device LED including the anode electrode ADE, the emission layer EL, and the cathode electrode CE may be disposed on the first substrate SUB1. Each of the first to third sub-pixels SPX1, SPX2, and SPX3 may include the light emitting device LED.

The encapsulation layer TFE may be disposed on the cathode electrode CTE. The encapsulation layer TFE may prevent impurities, moisture, etc. from penetrating into the light emitting device LED from the outside. The encapsulation layer TFE may include at least one inorganic encapsulation layer and at least one organic encapsulation layer. For example, the inorganic encapsulation layer may include silicon oxide, silicon nitride, or silicon oxynitride, and the organic encapsulation layer may include a cured polymer such as polyacrylate.

The color conversion substrate 200 may include a second substrate SUB2, first to third color filter layers CF1, CF2, CF3, a refractive layer RL, a first capping layer CPL1, a bank layer BNK, a first color conversion layer CCL1, a second color conversion layer CCL2, a light transmission layer LTL, and a second capping layer CPL2.

The second substrate SUB2 may include a transparent material or an opaque material. In an embodiment, examples of the material that can be used as the second substrate SUB2 may include glass, quartz, plastic, or the like. These may be used alone or in combination with each other. The second substrate SUB2 may be configured as a single layer or as a multi-layer in combination with each other.

The first to third color filter layers CF1, CF2, and CF3 may be disposed under the second substrate SUB2. In detail, each of the first to third color filter layers CF1, CF2, and CF3 may be arranged in the order of the third color filter layer CF3, the first color filter layer CF1, and the second color filter layer CF2 under the second substrate SUB2. The first to third color filter layers CF1, CF2, and CF3 may selectively transmit light having a specific wavelength.

The first color filter layer CF1 may partially overlap the first color conversion layer CCL1, the second color filter layer CF2 may partially overlap the second color conversion layer CCL2, and the third color filter layer CF3 may partially overlap the light transmission layer LTL.

In an embodiment, the first color filter layer CF1 may transmit red light Lr and block lights having a color different from that of red light Lr. The second color filter layer CF2 may transmit green light Lg and block lights having a color different from that of green light Lg. The third color filter layer CF3 may transmit the blue light Lb and block light having a color different from the blue light Lb.

The refractive layer RL may be disposed under the first to third color filter layers CF1, CF2, and CF3. The refractive layer RL may cover the first to third color filter layers CF1, CF2, and CF3. The refractive layer RL may control a path of light emitted from the lower portion. For example, the refractive layer RL may change the path of the obliquely incident light in the front direction (i.e., in the third direction D3). Accordingly, the refractive layer RL may increase the luminous efficiency of the display device 10. In an embodiment, the refractive layer RL may include an organic material.

The first capping layer CPL1 may be disposed under the refractive layer RL. In an embodiment, the first capping layer CPL1 may include a silicon compound.

The bank layer BNK may be disposed under the first capping layer CPL1. Multiple openings may be formed in the bank layer BNK. The bank layer BNK may form a space for accommodating the ink composition in the process of forming the first color conversion layer CCL1, the second color conversion layer CCL2, and the light transmission layer LTL. For example, the bank layer BNK may have a grid shape or a matrix shape in plan view. In an embodiment, the bank layer BNK may include an organic material.

The first color conversion layer CCL1, the second color conversion layer CCL2, and the light transmission layer LTL may be disposed under the first capping layer CPL1. For example, the first color conversion layer CCL1, the second color conversion layer CCL2, and the light transmission layer LTL may be respectively disposed in the openings of the bank layer BNL. The first color conversion layer CCL1 may overlap the area where the first sub-pixel SPX1 is disposed, and the second color conversion layer CCL2 may overlap the area where the second sub-pixel SPX2 is disposed, and the light transmission layer LTL may overlap an area in which the third sub-pixel SPX3 is disposed.

The first color conversion layer CCL1 and the second color conversion layer CCL2 may convert light emitted from the light emitting device LED into light having a specific wavelength. For example, the first color conversion layer CCL1 may convert light L1 (i.e., blue light) emitted from the light emitting device LED into light Lr of a first color. The second color conversion layer CCL2 may convert the light L1 emitted from the light emitting device LED into light Lg of the second color. The light transmission layer LTL may transmit the light L1 emitted from the light emitting device LED. In an embodiment, the first color may be red, and the second color may be green. The light transmission layer LTL may transmit blue light Lb. However, the disclosure is not limited thereto.

The first color conversion layer CCL1 may include first color conversion particles excited by the light L1 generated from the light emitting device LED to emit the light of the first color (i.e., the red light Lr). The first color conversion layer CCL1 may further include a first photosensitive polymer in which first scattering particles are dispersed.

The second color conversion layer CCL2 may include second color conversion particles excited by the light L1 generated from the light emitting device LED to emit the second light or the second color (i.e., green light Lg). The second color conversion layer CCL2 may further include a second photosensitive polymer in which second scattering particles are dispersed. Each of the first color conversion particles and the second color conversion particles may mean a quantum dot.

The light transmission layer LTL may transmit the light L1 generated from the light emitting device LED and emit it in the third direction D3. The light transmission layer LTL may include a third photosensitive polymer in which third scattering particles are dispersed. For example, each of the first to third photosensitive polymers may include an organic material having light transmittance, such as a silicone resin or an epoxy resin. The first to third photosensitive polymers may include the same material. The first to third scattering particles may scatter and emit light L1 generated from the light emitting device LED, and the first to third scattering particles may include the same material.

The second capping layer CPL2 may be disposed under the bank layer BNK, the first color conversion layer CCL1, the second color conversion layer CCL2, and the light transmission layer LTL. For example, the second capping layer CPL2 may cover the bank layer BNK, the first color conversion layer CCL1, the second color conversion layer CCL2, and the light transmitting layer LTL. In an embodiment, the second capping layer CPL2 may include a silicon compound.

The filling layer FL may be disposed between the array substrate 100 and the color conversion substrate 200. For example, the filling layer FL may act as a buffer against external pressure applied to the display device 10. For example, the filling layer FL may maintain a gap between the array substrate 100 and the color conversion substrate 200. In another embodiment, the filling layer FL may be omitted.

Although the display device 10 of the disclosure is disclosed in the context of an organic light emitting display device (OLED), the configuration of the disclosure is not limited thereto. In other embodiments, the display device 10 may include a liquid crystal display device (LCD), a field emission display device (FED), a plasma display device (PDP), an electrophoretic display device (EPD), a quantum dot display device, or an inorganic light emitting display device.

Figure 3:
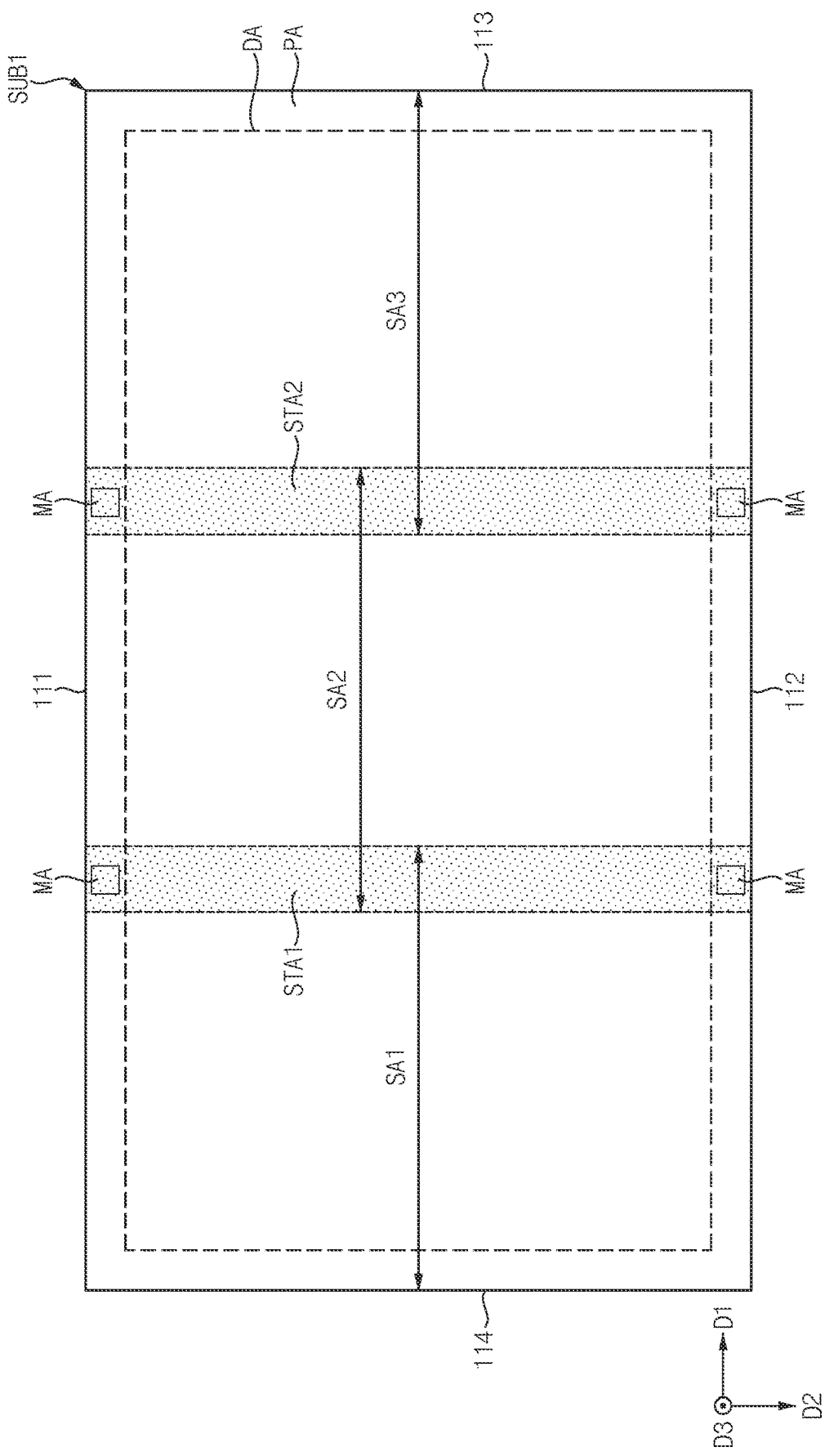
FIG. 3 is a schematic plan view illustrating a first substrate according to an embodiment.
Figure 4:
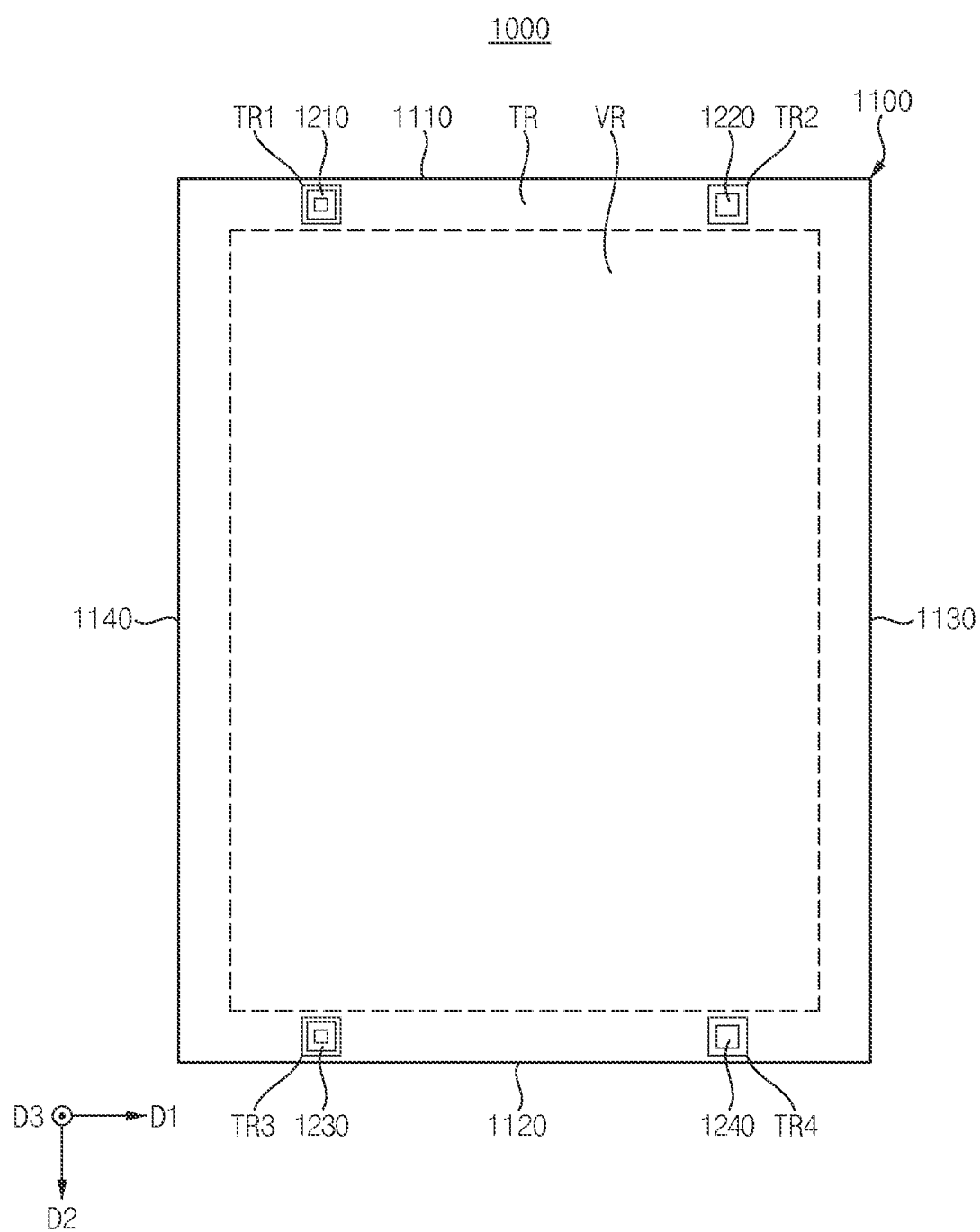
FIG. 4 is a schematic plan view illustrating an exposure mask according to an embodiment.

FIG. 3 is a schematic plan view illustrating a first substrate according to an embodiment, and FIG. 4 is a schematic plan view illustrating an exposure mask according to an embodiment.

Referring to FIGS. 1 to 4, the array substrate 100 may be formed by performing exposure processes multiple times on the first substrate SUB1 using the exposure mask 1000. Hereinafter, a unit of one exposure process performed using the exposure mask 1000 is defined as a shot, and an exposure area of the first substrate SUB1 corresponding to one shot is defined as a shot area. In other words, the exposure mask 1000 may correspond to one shot area of the first substrate SUB1 in one exposure process.

As the display device 10 includes the display area DA and the peripheral area PA, the first substrate SUB1 may include the display area DA and the peripheral area PA. Specifically, in case that the first substrate SUB1 has a rectangular shape, the display area DA may be positioned in the center of the first substrate SUB1, and the peripheral area PA may be positioned along the first side part 111, the second side part 112, the third side part 113, and the fourth side part 114 of the substrate SUB1 to surround the display area DA. For example, the first side part 111 may be positioned on the upper side of the first substrate SUB1, the second side part 112 may be positioned on the lower side of the first substrate SUB1, the third side part 113 may be positioned on the right side of the first substrate SUB1, and the fourth side part 114 may be positioned on the left side of the first substrate SUB1.

In the process of manufacturing the array substrate 100, a material layer may be deposited on the first substrate SUB1 to form an insulating layer. For example, the material layer may include an organic material layer, an inorganic material layer, and/or the like. A photoresist layer may be applied on the material layer. For example, the photoresist layer may include a polymer compound having photosensitivity. The material layer and the photoresist layer may be formed in the display area DA and the peripheral area PA of the first substrate SUB1. The first substrate SUB1 on which the material layer and the photoresist layer may be applied may be divided into multiple shot areas. The insulating layer may be formed by matching the exposure mask 1000 to each of the shot areas of the first substrate SUB1 and irradiating light to the exposure mask 1000. This will be described later in more detail with reference to FIGS. 9 to 18.

As the size of the display device 10 increases, the size of the first substrate SUB1 may also increase. As described above, in case that the first substrate SUB1 is divided into multiple shot areas for exposure, the exposure mask 1000 having a relatively small size may be used. Accordingly, the exposure mask 1000 may be readily managed, and the manufacturing cost of the display device 10 may be reduced.

In an embodiment, as shown in FIG. 3, the first substrate SUB1 may be divided into first to third shot areas SA1, SA2, and SA3 to be exposed in three shots. For example, the first substrate SUB1 may be divided into first to third shot areas SA1, SA2, and SA3 including one row and three columns for exposure. However, the disclosure is not necessarily limited thereto, and the first substrate SUB1 may be divided into four or more shot areas including two or more rows and two or more columns for exposure. For example, the first substrate SUB1 may be exposed to light by being divided into six shot areas including two rows and three columns.

The first to third shot areas SA1, SA2, and SA3 may overlap each other. An area where the first to third shot areas SA1, SA2, and SA3 overlap each other may be defined as a stitch area. For example, an area where the first shot area SA1 and the second shot area SA2 overlap may be defined as the first stitch area STA1, and an area where the second shot area SA2 and the third shot area SA3 overlap may be defined as the second stitch area STA2. The first stitch area STA1 and the second stitch area STA2 may extend in the second direction D2. In other words, the first stitch area STA1 and the second stitch area STA2 may extend parallel to the third side part 113 and the fourth side part 114 of the first substrate SUB1.

Measurement areas MA may be positioned in each of the first stitch area STA1 and the second stitch area STA2. Whether the exposure mask 1000 has an alignment error may be determined through the measurement areas MA. In an embodiment, the measurement areas MA may be positioned in an area in which the first stitch area STA1 and the peripheral area PA of the first substrate SUB1 overlap, and an area in which the second stitch area STA2 and the peripheral area PA of SUB1 overlap. For example, the measurement areas MA may be positioned along the first side part 111 and the second side part 112 of the first substrate SUB1. The measurement areas MA may be spaced apart from each other.

Hereinafter, the exposure mask 1000 according to an embodiment will be described in more detail with reference to FIG. 4.

In an embodiment, the exposure mask 1000 may include a base layer 1100, a first inspection transmission pattern 1210, and a second inspection transmission pattern 1220.

The base layer 1100 may include glass, plastic, and/or the like. In an embodiment, the base layer 1100 may have a rectangular shape in plan view. However, the disclosure is not necessarily limited thereto, and the base layer 1100 may have various shapes in plan view.

In case that the base layer 1100 has a rectangular shape in plan view, the lengths of opposite edges of the base layer 1100 may be substantially the same. Specifically, the length of the first edge 1110 of the base layer 1100 may be substantially the same as the length of the second edge 1120 facing the first edge 1110. The length of the third edge 1130 connecting the first edge 1110 and the second edge 1120 may be substantially the same as the length of the fourth edge 1140 facing the third edge 1130.

For example, the first edge 1110 may be positioned on the upper side of the base layer 1100, the second edge 1120 may be positioned on the lower side of the base layer 1100, the third edge 1130 may be positioned on the right side of the base layer 1130, and the fourth edge 1140 may be positioned on the left side of the base layer 1100.

In an embodiment, the base layer 1100 may be divided into an effective pattern forming area VR and an inspection pattern forming area TR. The effective pattern forming area VR may be positioned in the center of the base layer 1100. The inspection pattern forming area TR may be positioned around the effective pattern forming area VR. For example, the inspection pattern forming area TR may be positioned along the first edge 1110, the second edge 1120, the third edge 1130 and the fourth edge 1140 of the base layer 1100 to surround the effective pattern forming area VR.

Although not shown, multiple patterns may be defined in the effective pattern forming area VR. In the process of forming the insulating layers of the display device 10 using the exposure mask 1000, multiple contact holes may be defined in the insulating layers by the patterns.

In an embodiment, the inspection pattern forming area TR may include a first area TR1 and a second area TR2. In an embodiment, the first area TR1 and the second area TR2 may be positioned along the first edge 1110 of the base layer 1100. The second area TR2 may be spaced apart from the first area TR1 in the first direction D1.

In an embodiment, the first inspection transmission pattern 1210 may be defined in the first area TR1 of the base layer 1100, and the second inspection transmission pattern 1220 may be defined in the second area TR2 of the base layer 1100. Accordingly, the second inspection transmission pattern 1220 may be spaced apart from the first inspection transmission pattern 1210 in the first direction D1.

In an embodiment, the first inspection transmission pattern 1210 and the second inspection transmission pattern 1220 may transmit light. Accordingly, after multiple exposure processes using the exposure mask 1000, the inspection resist pattern may be formed on the photoresist layer on the first substrate SUB1 by the first inspection transmission pattern 1210 and the second inspection transmission pattern 1220. For example, the inspection resist pattern formed by the first inspection transmission pattern 1210 and the second inspection transmission pattern 1220 may be positioned along the first side part 111 of the first substrate SUB1. Accordingly, it may be possible to determine whether the exposure mask 1000 has an alignment error from the inspection resist pattern.

Figure 5:
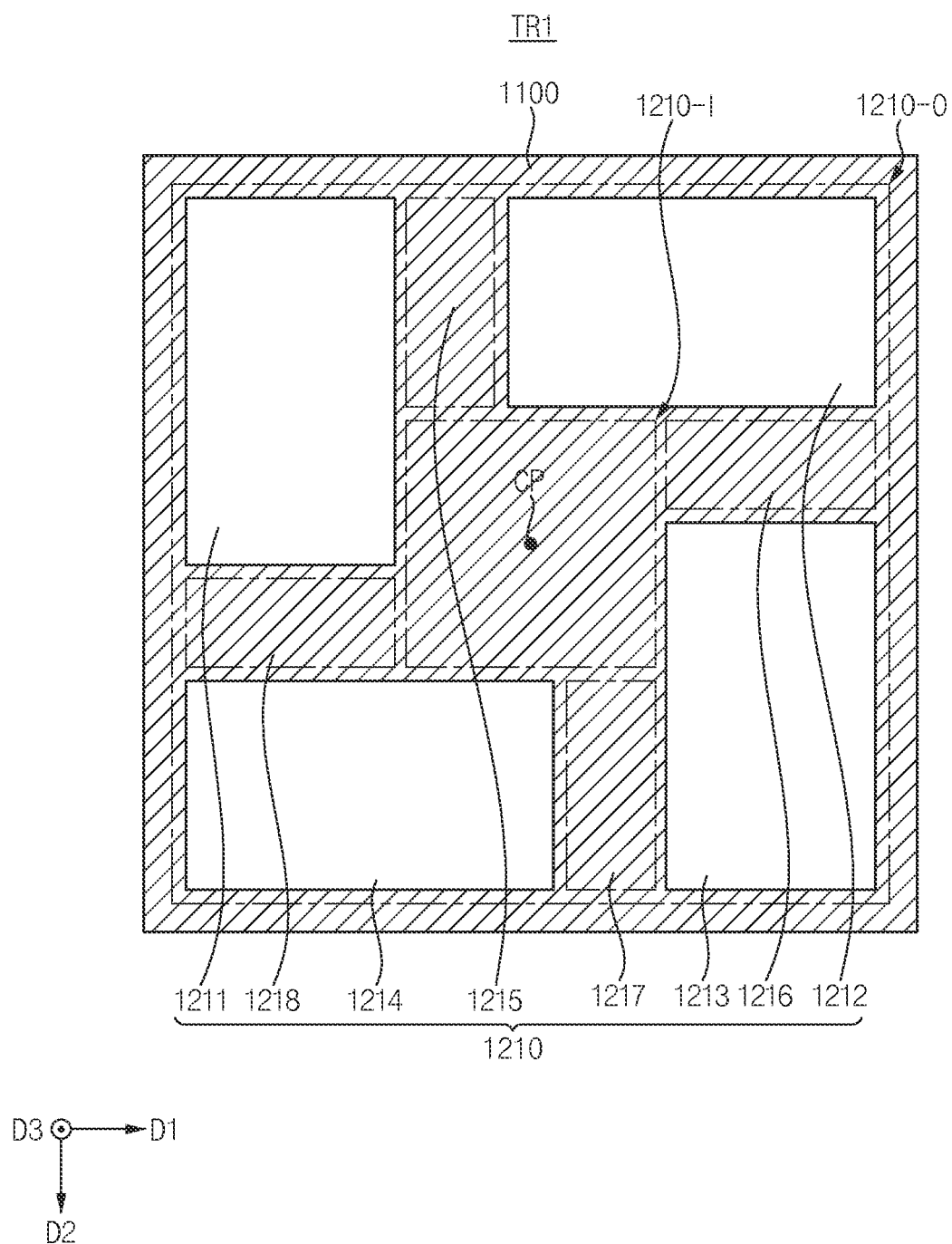
FIG. 5 is a schematic plan view illustrating a first area of the exposure mask of FIG. 4.

FIG. 5 is a schematic plan view illustrating a first area of the exposure mask of FIG. 4.

Referring to FIGS. 4 and 5, the first inspection transmission pattern 1210 may be arranged in a ring shape in plan view. The ring shape means a ring shape, and may include an outer shape and an inner shape.

In an embodiment, as shown in FIG. 5, the first inspection transmission pattern 1210 may have a rectangular ring shape in plan view. In other words, the outer shape 1210-O and the inner shape 1210-I of the first inspection transmission pattern 1210 may have a rectangular shape. However, the disclosure is not necessarily limited thereto, and in another embodiment, the first inspection transmission pattern 1210 may have a polygonal ring shape other than a rectangular ring, a circular ring shape, or the like. In other words, the outer shape 1210-O and the inner shape 1210-I of the first inspection transmission pattern 1210 may have a polygonal shape other than a rectangular shape, a circular shape, or the like.

In an embodiment, the first inspection transmission pattern 1210 may include at least one connection part. The connection part may connect the base layer 1100 positioned inside of the first inspection transmission pattern 1210 and the base layer 1100 positioned outside of the first inspection transmission pattern 1210. In other words, the first inspection transmission pattern 1210 may be arranged in a ring shape in which a portion is cut off by the connection part in plan view. For example, the first inspection transmission pattern 1210 may be arranged in a ring shape having multiple transmission parts and at least one connection part. The transmission parts may transmit light, and the connection part may block light.

In an embodiment, the first inspection transmission pattern 1210 may include first to fourth transmission parts 1211, 1212, 1213, 1214 and first to fourth connection parts 1215, 1216, 1217, and 1218.

Each of the first to fourth transmission parts 1211, 1212, 1213, and 1214 may be spaced apart from each other. For example, the second transmission part 1212 may be spaced apart from the first transmission part 1211 in the first direction D1, the third transmission part 1213 may be spaced apart from the second transmission part 1212 in the second direction D2, and the fourth transmission part 1214 may be spaced apart from the third transmission part 1213 in a direction opposite to the first direction D1 and spaced apart from the first transmission portion 1211 in the second direction D2.

In an embodiment, each of the first to fourth transmission parts 1211, 1212, 1213, and 1214 may have a rectangular shape in plan view. However, the disclosure is not necessarily limited thereto, and the planar shape of each of the first to fourth transmission parts 1211, 1212, 1213, and 1214 may vary according to the planar shape of the first inspection transmission pattern 1210.

The first to fourth connection parts 1215, 1216, 1217, and 1218 may be defined between the first to fourth transmission parts 1211, 1212, 1213, and 1214, respectively. For example, the first connection part 1215 may be defined between the first transmission part 1211 and the second transmission part 1212, the second connection part 1216 may be defined between the second transmission part 1212 and the third transmission part 1213, the third connection part 1217 may be defined between the third transmission part 1213 and the fourth transmission part 1214, and the fourth connection part 1218 may be defined between the first transmission part 1211 and the fourth transmission part 1214.

In an embodiment, in case that each of the first to fourth transmission parts 1211, 1212, 1213, and 1214 has a rectangular shape in plan view, each of the first to fourth connection parts 1215, 1216, 1217, and 1218 may also have a rectangular shape in plan view. However, the disclosure is not necessarily limited thereto.

As described above, the base layer 1100 positioned inside of the first inspection transmission pattern 1210 and the base layer 1100 positioned outside of the first inspection transmission pattern 1210 may be connected to each other by the first to fourth connection parts 1215, 1216, 1217, and 1218. Accordingly, even after the photoresist layer on the first substrate SUB1 is divided and exposed using the exposure mask 1000, the photoresist layer may have an entirely connected shape. In other words, even after the photoresist layer is divided and exposed using the exposure mask 1000, an island pattern of the photoresist layer may not occur. Accordingly, in the process of manufacturing the display device, a process defect due to the island pattern may be prevented.

In an embodiment, the first inspection transmission pattern 1210 may be point-symmetric with respect to a central point CP of the first inspection transmission pattern 1210 in plan view. For example, each of the first to fourth transmission parts 1211, 1212, 1213, and 1214 may have the same planar shape and the same size, and may be sequentially arranged in a clockwise direction around the central point CP. Each of the first to fourth connection parts 1215, 1216, 1217, and 1218 may have the same planar shape and the same size, and may be sequentially arranged in a clockwise direction with respect to the central point CP. Accordingly, it may be possible to more readily determine whether the exposure mask 1000 has an alignment error from the inspection resist pattern formed from the first inspection transmission pattern 1210.

Figure 6:
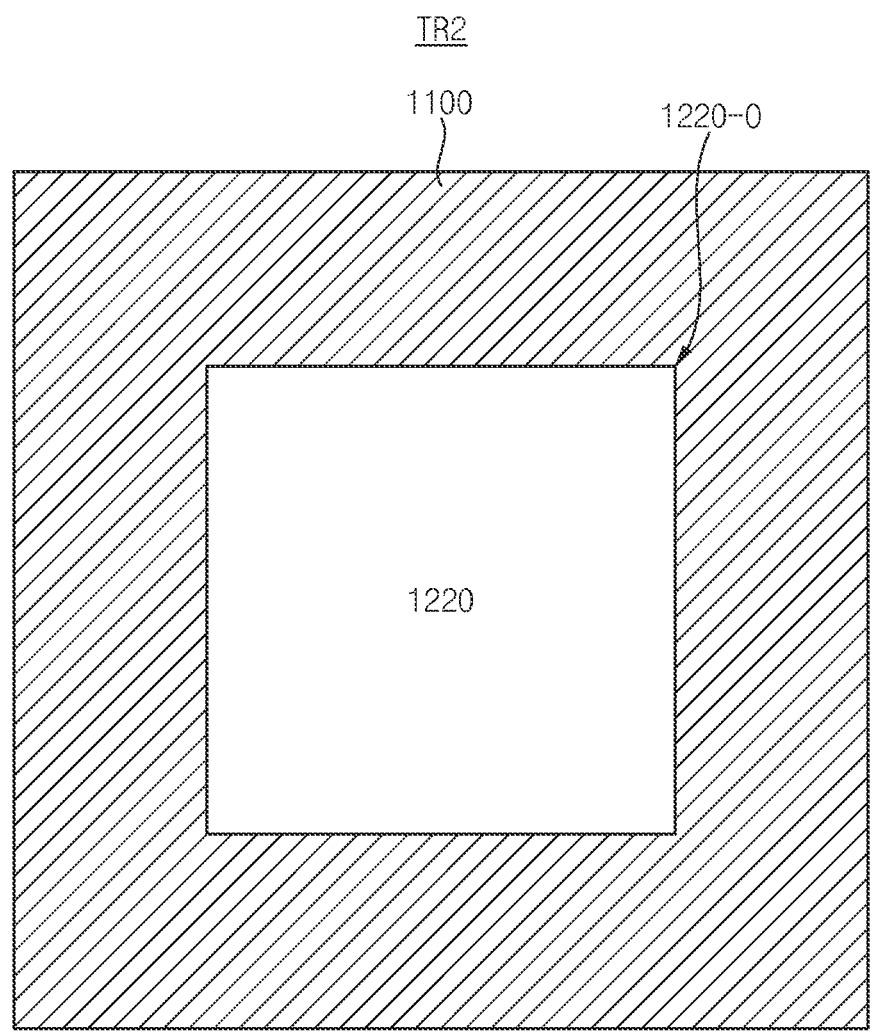
FIG. 6 is a schematic plan view illustrating a second area of the exposure mask of FIG. 4.

FIG. 6 is a schematic plan view illustrating a second area of the exposure mask of FIG. 4.

Referring to FIGS. 4 and 6, according to an embodiment, the second inspection transmission pattern 1220 may be arranged in a polygonal shape or a circular shape in plan view. In other words, the outer shape 1220-O of the second inspection transmission pattern 1220 may have a polygonal shape or a circular shape, and the inner shape of the second inspection transmission pattern 1220 may not exist.

In an embodiment, as shown in FIG. 6, the second inspection transmission pattern 1220 may have a rectangular shape in plan view. In other words, the outer shape 1220-O of the second inspection transmission pattern 1220 may have a rectangular shape, and the inner shape of the second inspection transmission pattern 1220 may not exist. However, the disclosure is not necessarily limited thereto, and the planar shape of the second inspection transmission pattern 1220 may vary.

In an embodiment, the second inspection transmission pattern 1220 may have a square shape in plan view. Accordingly, it may be possible to more readily determine whether the exposure mask 1000 has an alignment error from the inspection resist pattern formed from the second inspection transmission pattern 1220.

FIG. 7 is a schematic view illustrating the first area of FIG. 5 and the second area of FIG. 6 overlapping each other.

Referring to FIGS. 4 to 7, in an embodiment, in case that the first inspection transmission pattern 1210 is moved in the first direction D1, the first inspection transmission pattern 1210 may overlap the second inspection transmission pattern 1220. In other words, in case that the first area TR1 is moved in the first direction D1 to correspond to the second area TR2, the first inspection transmission pattern 1210 may overlap the second inspection transmission pattern 1220.

In an embodiment, the outer shape 1220-O of the second inspection transmission pattern 1220 may be smaller than the outer shape 1210-O of the first inspection transmission pattern 1210, and may be larger than the inner shape 1210-I of the first inspection transmission pattern 1210. Accordingly, in case that the first inspection transmission pattern 1210 overlaps the second inspection transmission pattern 1220, the second inspection transmission pattern 1220 may be positioned inside of the outer shape 1210-O of the first inspection transmission pattern 1210, and the inner shape 1210-I of the first inspection transmission pattern 1210 may be positioned inside of the second inspection transmission pattern 1220.

In an embodiment, in case that the first inspection transmission pattern 1210 overlaps the second inspection transmission pattern 1220, the first to fourth transmission parts 1211, 1212, 1213, 1214 of the first inspection transmission pattern 1210 may overlap a corner of the second inspection transmission pattern 1220.

According to embodiments, the exposure mask 1000 having a relatively small size may be used by dividing the first substrate SUB1 into the shot areas and exposing them to light using the exposure mask 1000. Accordingly, the exposure mask 1000 may be readily managed, and the manufacturing cost of the display device 10 may be reduced.

The exposure mask 1000 may include a first inspection transmission pattern 1210 and a second inspection transmission pattern 1220. The first inspection transmission pattern 1210 may have a ring shape having at least one connection part, and the second inspection transmission pattern 1220 may have a polygonal shape or a circular shape. Accordingly, in case that the exposure and development processes are repeatedly performed on the first substrate SUB1 while moving the exposure mask 1000, the inspection resist pattern may be defined on the photoresist layer on the first substrate SUB1. Accordingly, it may be possible to readily determine whether the exposure mask 1000 has an alignment error from the inspection resist pattern.

According to the exposure mask 1000, even in case that the inspection resist pattern is defined on the photoresist layer, the photoresist layer may have an entirely connected shape. For example, the island pattern of the photoresist layer may not occur. Accordingly, in the process of manufacturing the display device 10, a process defect due to the island pattern may be prevented.

Referring to FIG. 4 again, in an embodiment, the inspection pattern forming area TR may further include a third area TR3 and a fourth area TR4. The third area TR3 and the fourth area TR4 may be positioned along the second edge 1120 of the base layer 1100. The fourth area TR4 may be spaced apart from the third area TR3 in the first direction D1. For example, the third area TR3 may be positioned to correspond to the first area TR1, and the fourth area TR4 may be positioned to correspond to the second area TR2.

In an embodiment, the exposure mask 1000 may further include a third inspection transmission pattern 1230 and a fourth inspection transmission pattern 1240. The third inspection transmission pattern 1230 may be defined in the third area TR3 of the base layer 1100, and the fourth inspection transmission pattern 1240 may be defined in the fourth area TR4 of the base layer 1100. Accordingly, the fourth inspection transmission pattern 1240 may be spaced apart from the third inspection transmission pattern 1230 in the first direction D1. For example, the third inspection transmission pattern 1230 may be positioned to correspond to the first inspection transmission pattern 1210, and the fourth inspection transmission pattern 1240 may be positioned to correspond to the second inspection transmission pattern 1220.

Accordingly, after multiple exposure processes using the exposure mask 1000, the inspection resist pattern may be formed in the photoresist layer on the first substrate SUB1 even by the third inspection transmission pattern 1230 and the fourth inspection transmission pattern 1240. For example, the inspection resist pattern formed by the third inspection transmission pattern 1230 and the fourth inspection transmission pattern 1240 may be positioned along the second side part 112 of the first substrate SUB1. Accordingly, it may be possible to more readily determine whether the exposure mask 1000 has an alignment error.

In an embodiment, the third inspection transmission pattern 1230 may have substantially the same planar shape as the first inspection transmission pattern 1210. In other words, the third inspection transmission pattern 1230 may be arranged in a ring shape having at least one connection part in plan view. For example, the third inspection transmission pattern 1230 may have a ring shape having multiple transmission parts and at least one connection part.

In an embodiment, the fourth inspection transmission pattern 1240 may have substantially the same planar shape as the second inspection transmission pattern 1220. In other words, the fourth inspection transmission pattern 1240 may be arranged in a polygonal shape or a circular shape, or the like in plan view.

FIGS. 8 to 20 are schematic views illustrating a method of manufacturing a display device according to an embodiment.

Figure 8:
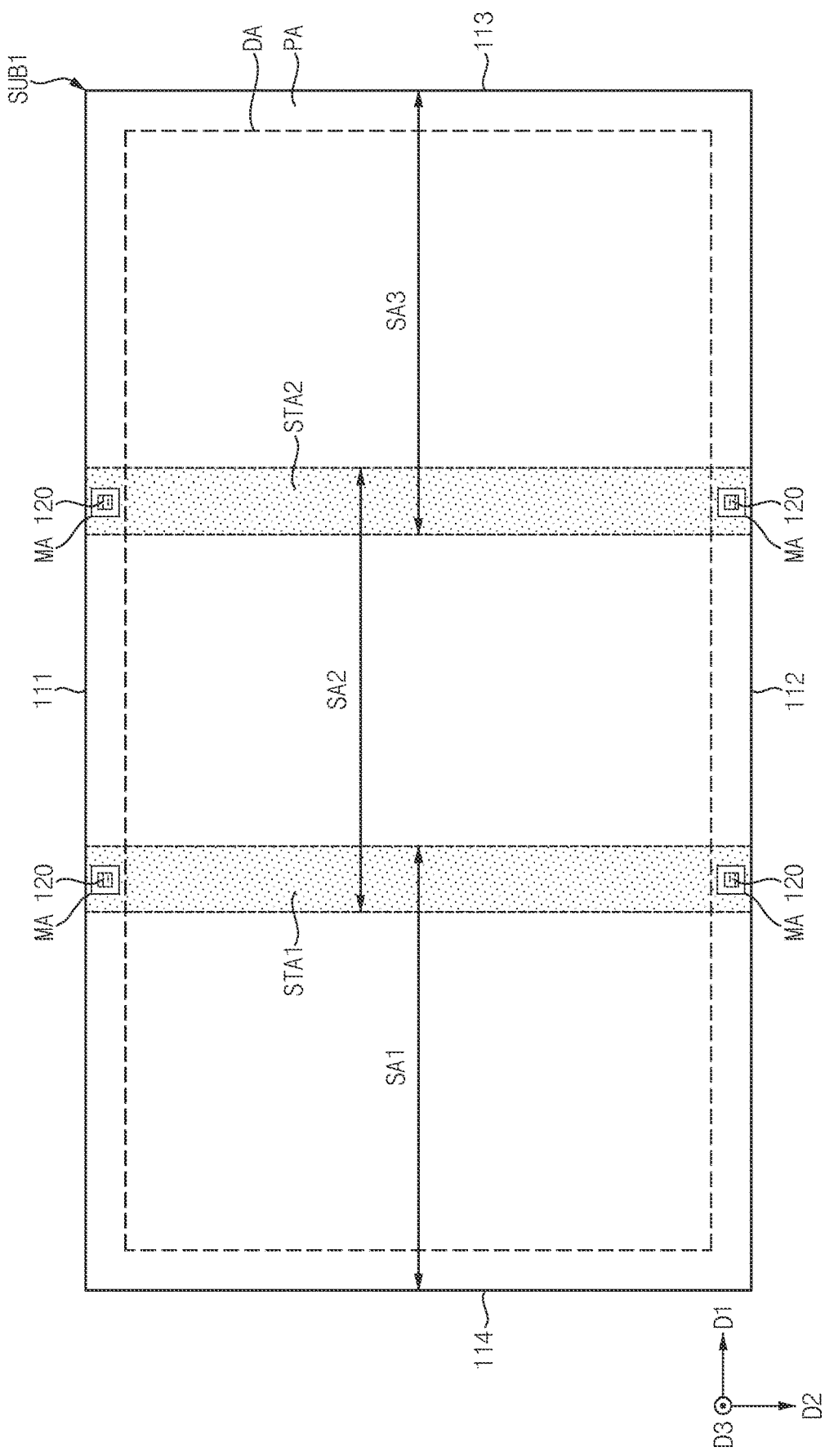

First, referring to FIG. 8, at least one reference pattern 120 may be formed on the first substrate SUB1. In an embodiment, each of the reference patterns 120 may be positioned in the measurement area MA. In other words, the reference patterns 120 may be positioned in an area where the first stitch area STA1 and the peripheral area PA of the first substrate SUB1 overlap and an area where the second stitch area STA2 and the peripheral area PA of the first substrate SUB1 overlap. For example, the reference patterns 120 may be positioned along the first side part 111 and the second side part 112 of the first substrate SUB1. The reference patterns 120 may be spaced apart from each other.

In an embodiment, the reference pattern 120 may be formed together with the back metal pattern BML of FIG. 2. In other words, the reference pattern 120 may include the same material as the back metal pattern BML. For example, the reference pattern 120 may be formed of a metal, an alloy, a conductive metal oxide, a transparent conductive material, or the like. Examples of materials that can be used as the reference pattern 120 may include silver (Ag), an alloy containing silver, molybdenum (Mo), an alloy containing molybdenum, aluminum (Al), an alloy containing aluminum, Aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and the like. These may be used alone or in combination with each other. Also, the reference pattern 120 may be configured as a single layer or as a multi-layer in combination with each other.

In an embodiment, the reference pattern 120 may have a rectangular shape in plan view. However, the disclosure is not necessarily limited thereto, and the reference pattern 120 may have a polygonal shape other than a rectangular shape, a circular shape, or the like in plan view. At least some of the reference patterns 120 may have a different planar shape from the other reference patterns 120.

Figure 9:
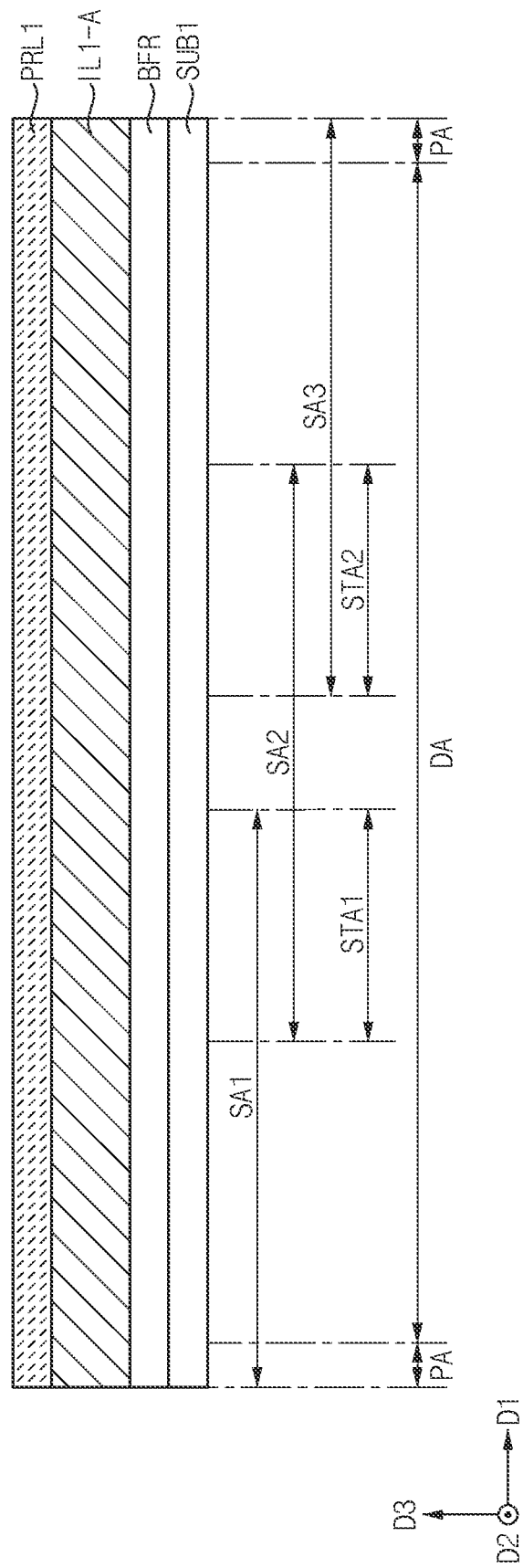

Referring to FIG. 9, the buffer layer BFR may be formed on the first substrate SUB1. The buffer layer BFR may be formed to cover the reference pattern 120 of FIG. 8. Thereafter, a first material layer IL1-A may be formed on the buffer layer BFR. In an embodiment, the first material layer IL1-A may include an inorganic insulating material. Examples of the inorganic insulating material that can be used as the first material layer IL1-A may include silicon oxide, silicon nitride, silicon oxynitride, and the like. These may be used alone or in combination with each other. The first material layer IL1-A may be formed in the display area DA and the peripheral area PA of the first substrate SUB1.

Thereafter, a first photoresist layer PRL1 may be formed on the first material layer IL1-A. The first photoresist layer PRL1 may include a photosensitive polymer compound. The first photoresist layer PRL1 may be formed in the display area DA and the peripheral area PA of the first substrate SUB1.

Figure 10:
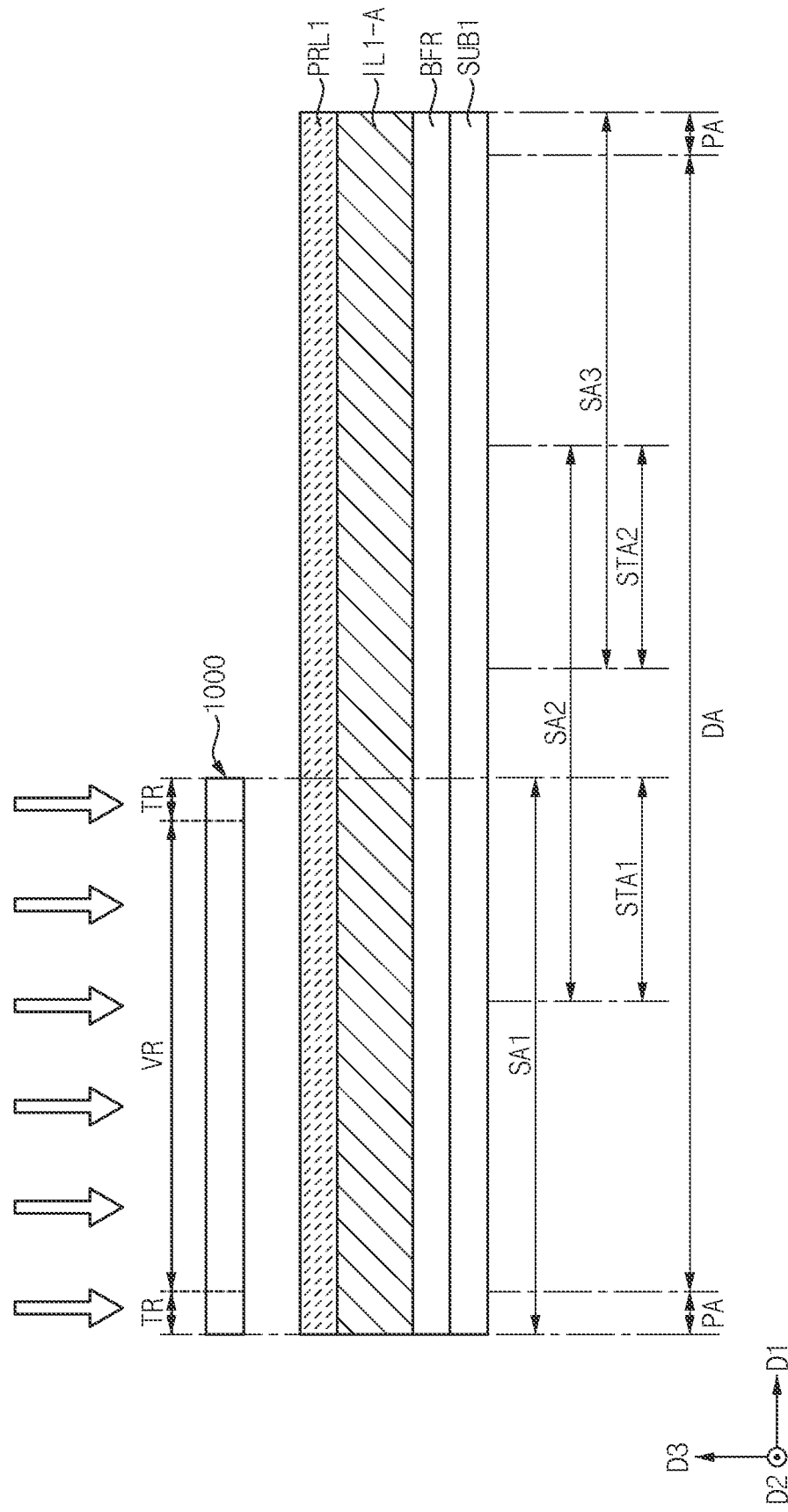

Thereafter, referring to FIG. 10, the exposure mask 1000 may correspond to the first shot area SA1 of the first substrate SUB1, and light may be irradiated to the exposure mask 1000. The size of the exposure mask 1000 may be smaller than the size of the first substrate SUB1. As described above, patterns may be formed on the exposure mask 1000. Accordingly, a portion of the light irradiated to the exposure mask 1000 may pass through the patterns to reach the first substrate SUB1. Accordingly, the light passing through the exposure mask 1000 may be irradiated onto the first photoresist layer PRL1.

Figure 11:
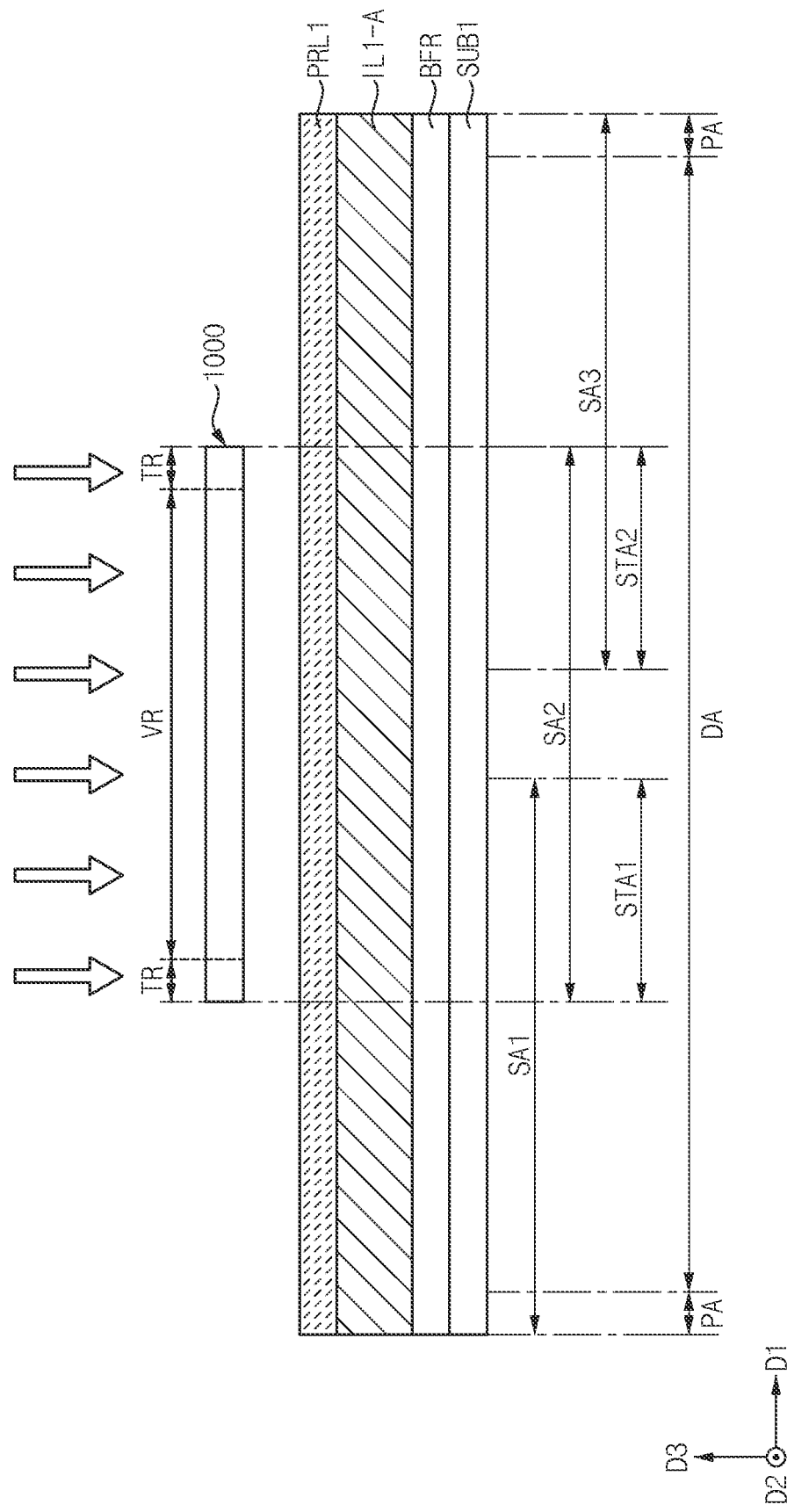

Thereafter, as shown in FIG. 11, the exposure mask 1000 may be moved, and light may be irradiated to the exposure mask 1000. For example, the exposure mask 1000 may be moved to correspond to the second shot area SA2 of the first substrate SUB1, and light may be irradiated to the exposure mask 1000. Light may be irradiated to the first stitch area STA1 in both the first exposure process of FIG. 10 and the second exposure process of FIG. 11. In other words, in the first stitch area STA1, the first photoresist layer PRL1 may be exposed again in the second exposure process.

Figure 12:
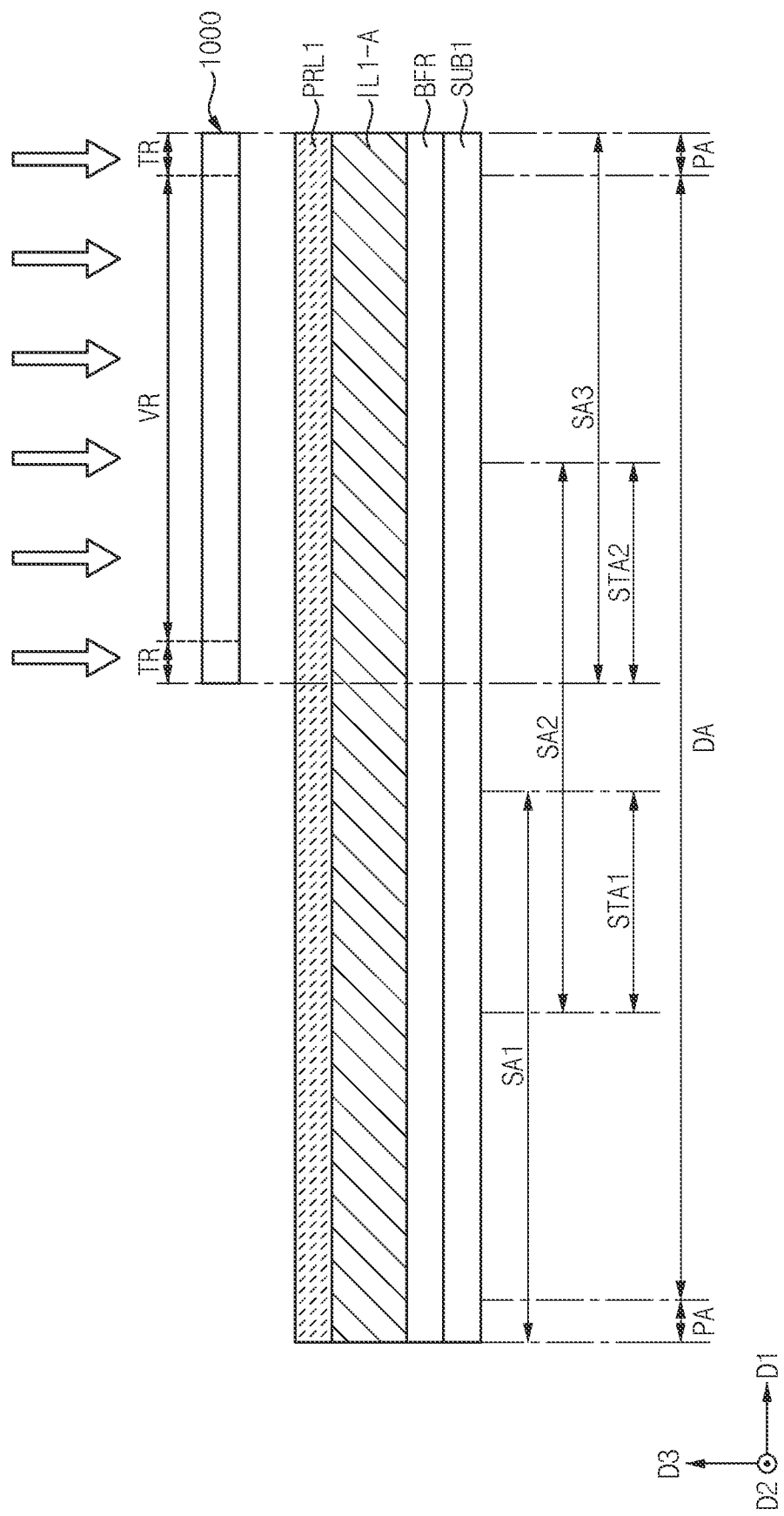

Thereafter, as shown in FIG. 12, the exposure mask 1000 may be moved, and light may be irradiated to the exposure mask 1000. For example, the exposure mask 1000 may be moved to correspond to the third shot area SA3 of the first substrate SUB1, and light may be irradiated to the exposure mask 1000. Light may be irradiated to the second stitch area STA2 in both the second exposure process of FIG. 11 and the third exposure process of FIG. 12. In other words, in the second stitch area STA2, the first photoresist layer PRL1 may be exposed again in the third exposure process.

As described above, in case that the first substrate SUB1 is divided into the first to third shot areas SA1, SA2, and SA3 for exposure, an exposure mask 1000 having a relatively small size may be used. Accordingly, the exposure mask 1000 may be readily managed, and the manufacturing cost of the display device 10 may be reduced.

Figure 13:
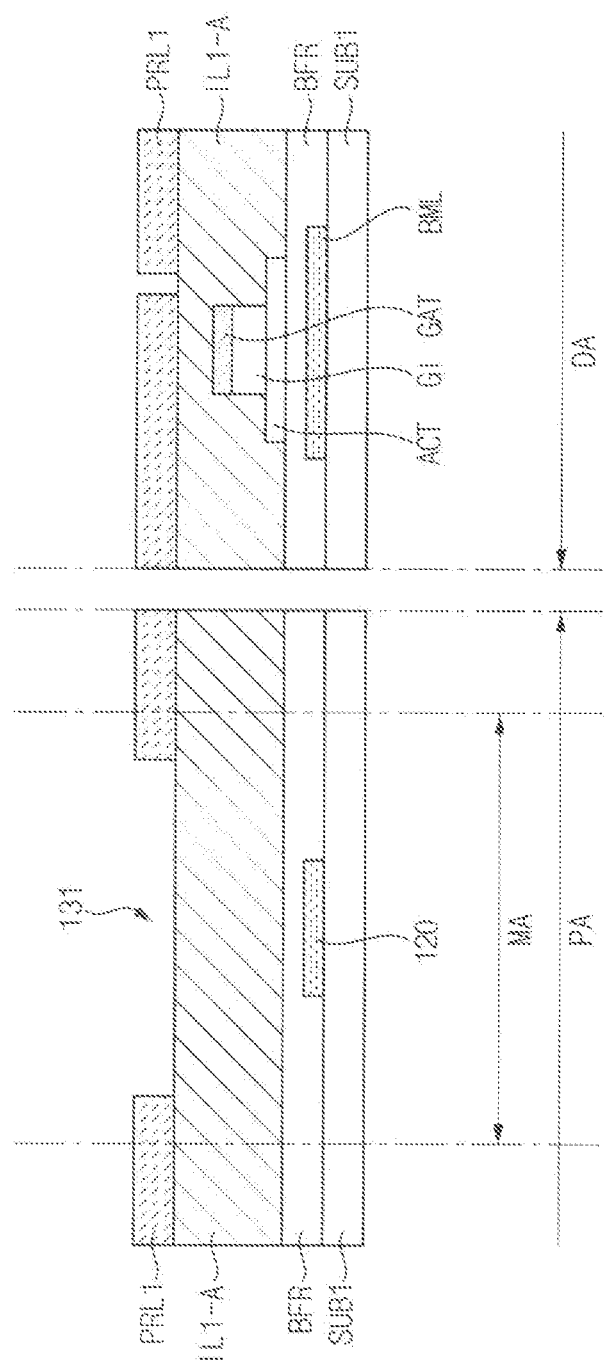
Figure 14:
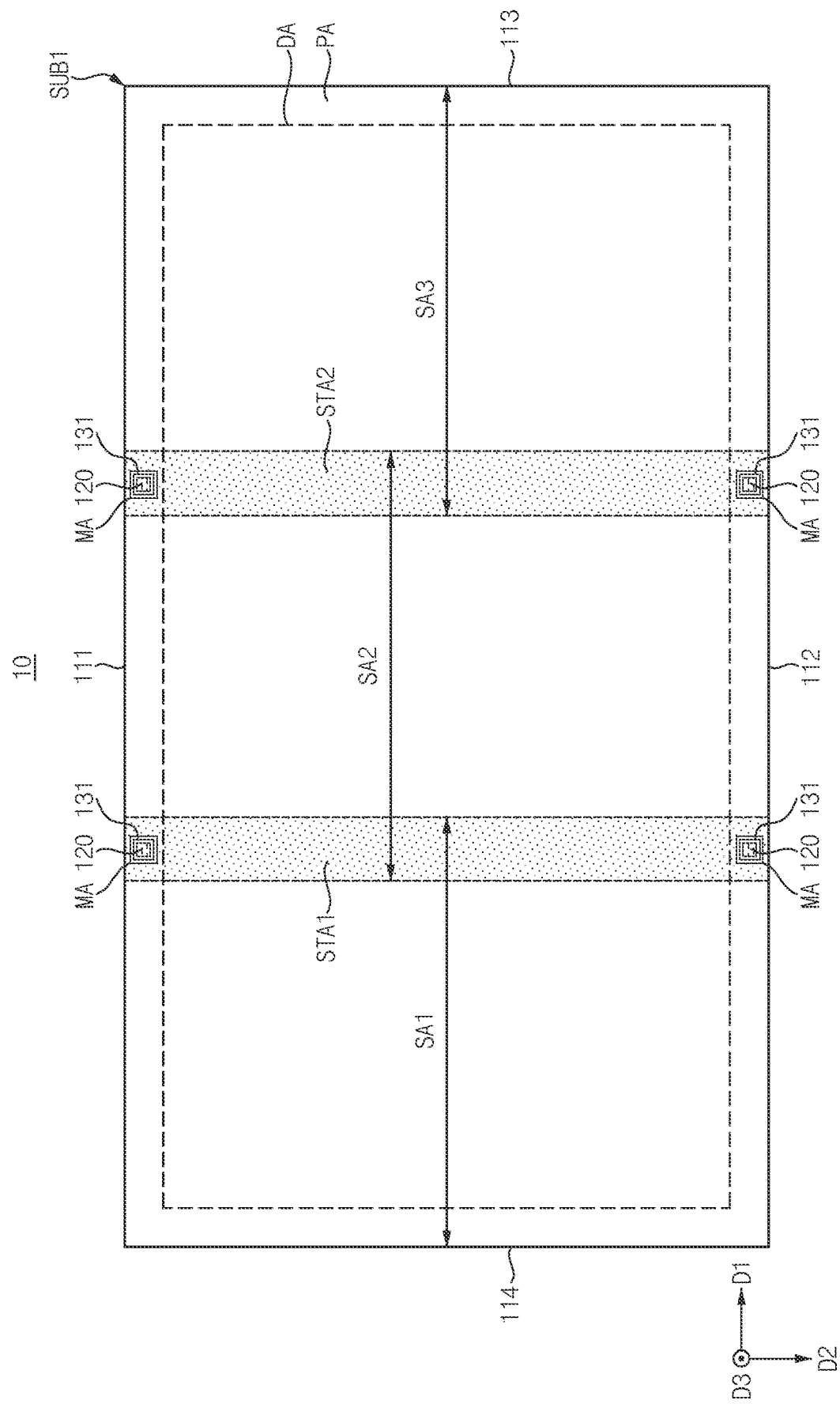

Thereafter, referring to FIGS. 13 to 15, the exposed first photoresist layer PRL1 may be developed to expose a portion of the first material layer IL1-A. For example, a portion irradiated with light of the first photoresist layer PRL1 may be removed, and a portion not irradiated with light may remain, so that the first photoresist layer PRL1 may expose a portion of the first material layer I-A.

In an embodiment, in case that the first photoresist layer PRL1 is developed, at least one first inspection resist pattern 131 may be formed. As shown in FIG. 13, the first inspection resist patterns 131 may be defined at the same level as the first photoresist layer PRL1.

In an embodiment, as shown in FIG. 14, each of the first inspection resist patterns 131 may be positioned in the measurement area MA. In other words, the first inspection resist patterns 131 may be positioned in an area where the first stitch area STA1 and the peripheral area PA of the first substrate SUB1 overlap and an area the second stitch area STA2 and the peripheral area PA of the first substrate SUB1 overlap. For example, the first inspection resist patterns 131 may be positioned along the first side part 111 and the second side part 112 of the first substrate SUB1. The first inspection resist patterns 131 may be spaced apart from each other.

In an embodiment, the first inspection resist pattern 131 may overlap the reference pattern 120 in plan view. For example, as shown in FIG. 15, the reference pattern 120 may be positioned at the center of the first inspection resist pattern 131. In an embodiment, the first inspection resist pattern 131 may be point-symmetric with respect to the reference pattern 120 in plan view.

In an embodiment, each of the first inspection resist patterns 131 may be formed by a combination of the first inspection transmission pattern 1210 and the second inspection transmission pattern 1220 of the exposure mask 1000, or a combination of the third inspection transmission pattern 1230 and the fourth inspection transmission pattern 1240. Hereinafter, for convenience of description, a process of forming the first inspection resist pattern 131 will be described based on the first inspection resist pattern 131 formed by the combination of the first inspection transmission pattern 1210 and the second inspection transmission pattern 1220.

In an embodiment, the first inspection resist pattern 131 may be formed on a portion irradiated with light to the first photoresist layer PRL1 by the first inspection transmission pattern 1210 and the second inspection transmission pattern 1220. In other words, as a portion irradiated with light to the first photoresist layer PRL1 by the first inspection transmission pattern 1210 and the second inspection transmission pattern 1220 is removed through development, the first inspection resist pattern 131 may be formed.

Accordingly, referring to FIG. 15, the first inspection resist pattern 131 may have substantially the same planar shape as an overlapping shape (Referring to FIG. 7) of the first inspection transmission pattern 1210 and the second inspection transmission pattern 1220. Specifically, the first inspection resist pattern 131 may have substantially the same planar shape as an overlapping shape (Referring to FIG. 7) of the first to fourth transmission parts 1211, 1212, 1213, and 1214 of the first inspection transmission pattern 1210 and the second inspection transmission pattern 1220. For example, the first inspection resist pattern 131 may have a polygonal shape or a circular shape in which a portion of an outer shape 131-O is recessed inward in plan view.

In an embodiment, the first inspection resist pattern 131 may have a rectangular shape in which a portion of each of the four sides forming the outer shape 131-O is recessed inward. However, the disclosure is not necessarily limited thereto, and the planar shape of the first inspection resist pattern 131 may vary depending on the planar shape of the first inspection transmission pattern 1210 and the second inspection transmission pattern 1220.

Referring to FIG. 16, it may be determined whether the exposure mask 1000 has an alignment error from the first inspection resist pattern 131. Specifically, in case that the reference pattern 120 is not positioned at the center of the first inspection resist pattern 131, it may be determined that an alignment error between the first substrate SUB1 and the exposure mask 1000 has occurred. For example, in case that at least one of first to fourth widths L1, L2, L3, and L4 of the first inspection resist pattern 131 has a different size from others, and/or at least one of fifth to eighth widths L5, L6, L7, and L8 of the first inspection resist pattern 131 has a different size from others, it may be determined that an alignment error of the exposure mask 1000 occurs in the exposure process.

In case that it is determined that there is an alignment error of the exposure mask 1000, all of the first photoresist layer PRL1 may be removed. Thereafter, the first photoresist layer PRL1 may be re-formed on the first material layer IL1-A, and the above-described exposure and development processes may be repeated.

In case that the reference pattern 120 is positioned at the center of the first inspection resist pattern 131, it may be determined that there is no alignment error between the first substrate SUB1 and the exposure mask 1000. Specifically, the first to fourth widths L1, L2, L3, and L4 of the first inspection resist pattern 131 may be the same as each other, and the fifth to eighth widths L5, L6, L7, and L8 of the first inspection resist pattern 131 may be the same as each other. Accordingly, it may be determined that there is no alignment error of the exposure mask 1000 in the exposure process.

Figure 17:
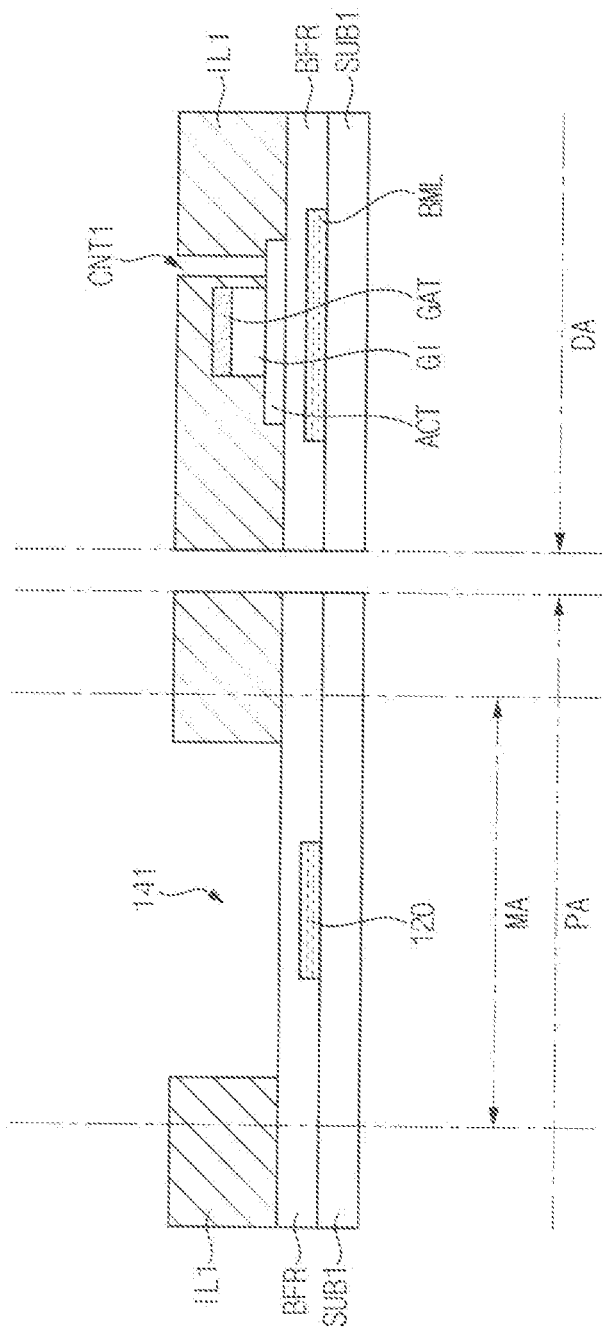
Figure 18:
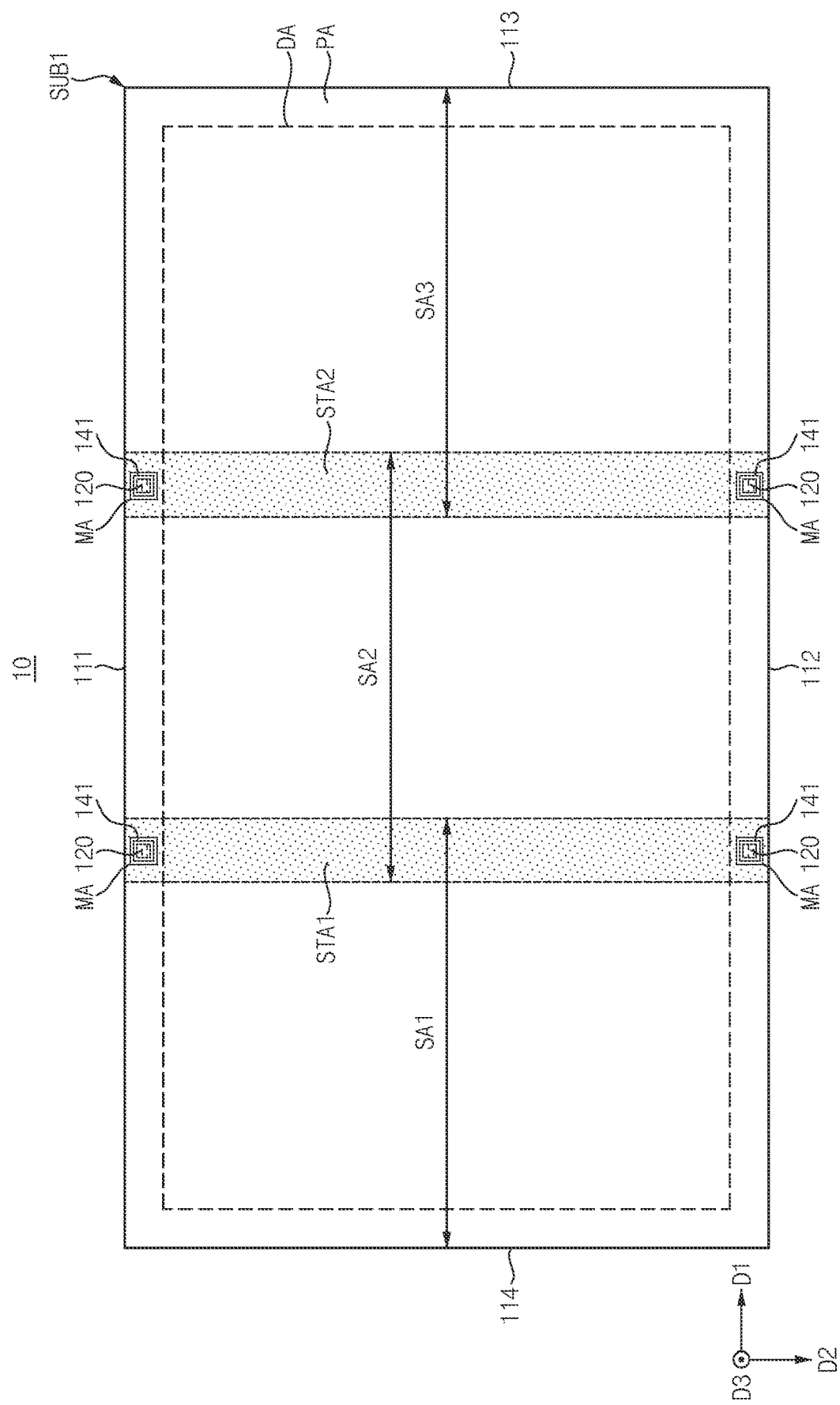
Figure 19:
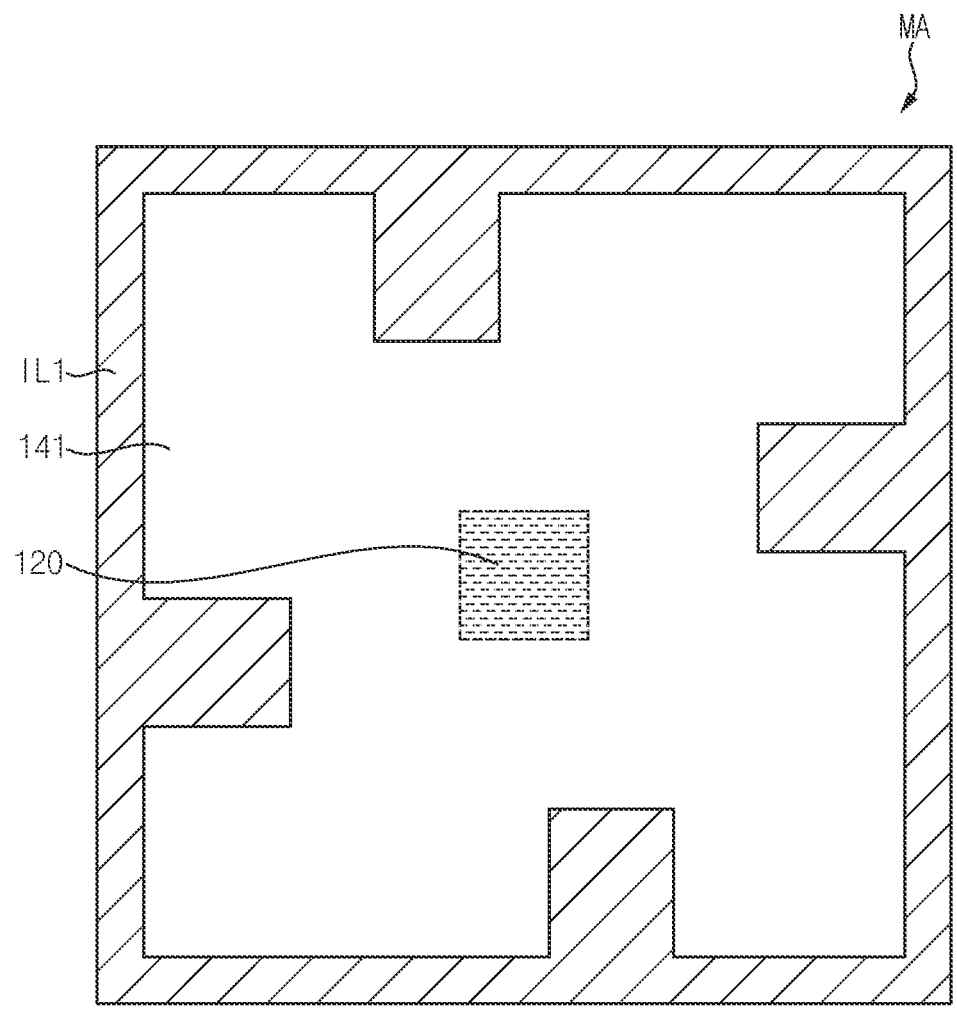

Referring to FIGS. 17 to 19, in case that it is determined that there is no alignment error of the exposure mask 1000, the first contact hole CNT1 may be formed in the first material layer IL1-A using the first photoresist layer PRL1 as a mask. After the first contact hole CNT1 is formed, the first photoresist layer PRL1 may be removed to form the first insulating layer IL1 in which the first contact hole CNT1 is defined. In an embodiment, the first contact hole CNT1 may be positioned in the display area DA of the first substrate SUB1.

In an embodiment, the first insulating layer IL1 may correspond to the first interlayer insulating layer ILD1 of FIG. 2. For example, the first insulating layer IL1 may cover the gate electrode GAT, and the first contact hole CNT1 may expose a portion of the active pattern ACT. In an embodiment, the first insulating layer IL1 may be formed of an inorganic insulating material. Examples of the inorganic insulating material that can be used as the first insulating layer IL1 may include silicon oxide, silicon nitride, silicon oxynitride, and the like. These may be used alone or in combination with each other.

In an embodiment, in case that the first contact hole CNT1 is formed, the first material layer IL1-A exposed by the first inspection resist pattern 131 may be etched together. Accordingly, at least one first opening pattern 141 may be defined in the first insulating layer IL1.

In an embodiment, each of the first opening patterns 141 may be positioned in the measurement areas MA. In other words, the first opening patterns 141 may be positioned in an area where the first stitch area STA1 and the peripheral area PA of the first substrate SUB1 overlap and an area where the second stitch area STA2 and the peripheral area PA of the first substrate SUB1 overlap. For example, the first opening patterns 141 may be positioned on the first side part 111 and the second side part 112 of the first substrate SUB1. The first opening patterns 141 may be spaced apart from each other.

In an embodiment, the first opening pattern 141 may have substantially the same planar shape as the first inspection resist pattern 131.

Figure 20:
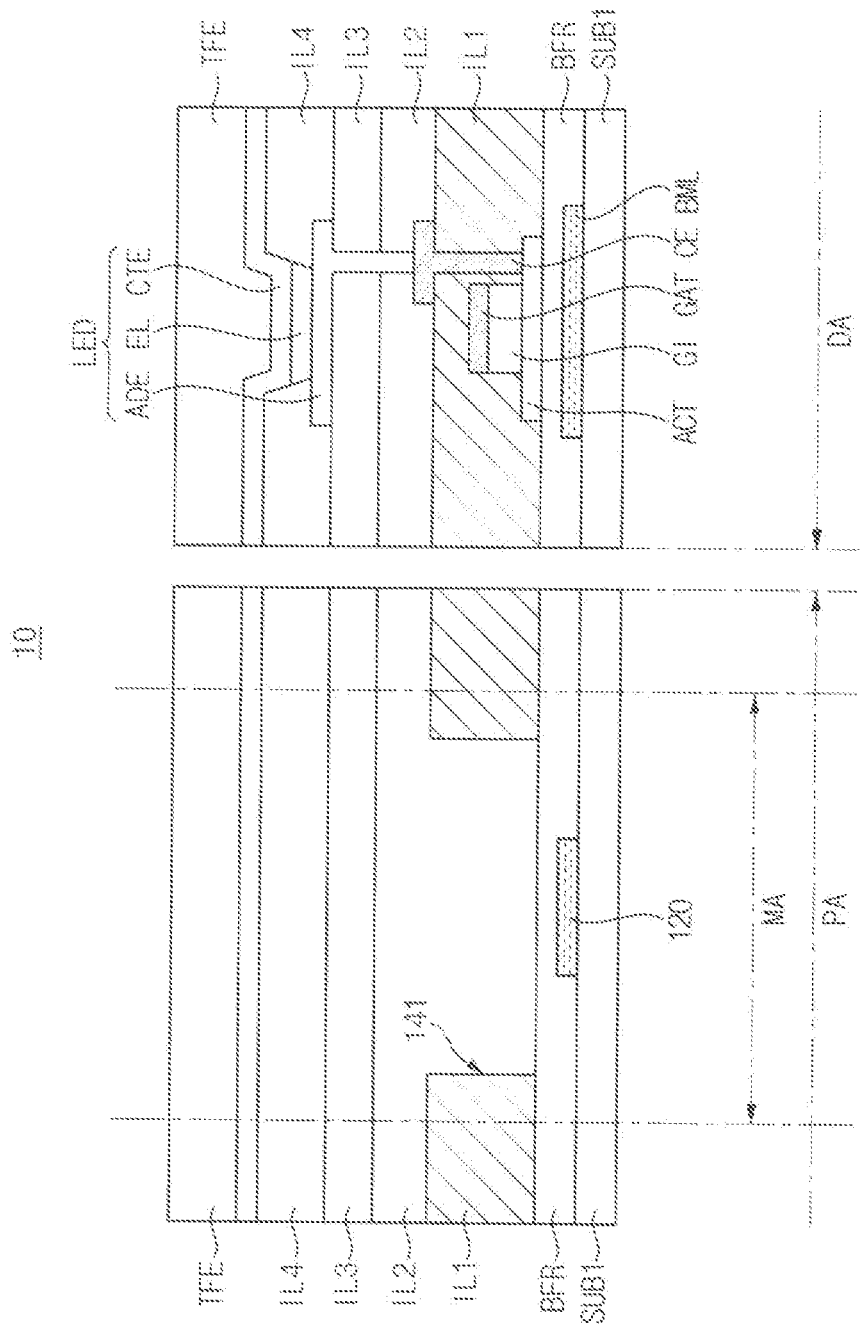

Referring to FIG. 20, the connection electrode CE may be formed on the first insulating layer IL1. The connection electrode CE may contact the active pattern ACT through the first contact hole CNT1. Thereafter, a second insulating layer IL2 may be formed on the first insulating layer IL1. The second insulating layer IL2 may correspond to the passivation layer PVX of FIG. 2. The second insulating layer IL2 may cover the connection electrode CE. In an embodiment, the second insulating layer IL2 may be formed to fill the first opening pattern 141. Thereafter, a third insulating layer IL3 may be formed on the second insulating layer IL2. The third insulating layer IL3 may correspond to the via insulating layer VIA of FIG. 2. Thereafter, the anode electrode ADE may be formed on the third insulating layer IL3. Thereafter, a fourth insulating layer IL4 may be formed on the third insulating layer IL3. The fourth insulating layer IL4 may correspond to the pixel defining layer PDL of FIG. 2. Thereafter, the emission layer EL, the cathode electrode CTE, and the encapsulation layer TFE may be sequentially formed on the fourth insulating layer IL4.

Thereafter, although not shown, the display device 10 may be formed by coating the filling layer FL of FIG. 2 on the encapsulation layer TFE and bonding the array substrate 100 and the color conversion substrate 200. In another embodiment, the filling layer FL may be omitted.

According to embodiments, the exposure mask 1000 having a relatively small size may be used by dividing the first substrate SUB1 into the multiple shot areas and exposing them using the exposure mask 1000. Accordingly, the exposure mask 1000 may be readily managed, and the manufacturing cost of the display device 10 may be reduced.

The exposure mask 1000 may include the first inspection transmission pattern 1210 and a second inspection transmission pattern 1220. The first inspection transmission pattern 1210 may have a ring shape having at least one connection part, and the second inspection transmission pattern 1220 may have a polygonal shape or a circular shape, or the like. Accordingly, in case that the exposure and development processes are repeatedly performed on the first substrate SUB1 while moving the exposure mask 1000, the inspection resist pattern may be defined in the photoresist layer on the first substrate SUB1. Accordingly, it may be possible to readily determine whether the exposure mask 1000 has an alignment error from the inspection resist pattern.

According to the exposure mask 1000, even in case that the inspection resist pattern is defined in the photoresist layer, the photoresist layer may have an entirely connected shape. For example, the island pattern of the photoresist layer may not occur. Therefore, a process defect due to the island pattern may be prevented.

Figure 21:
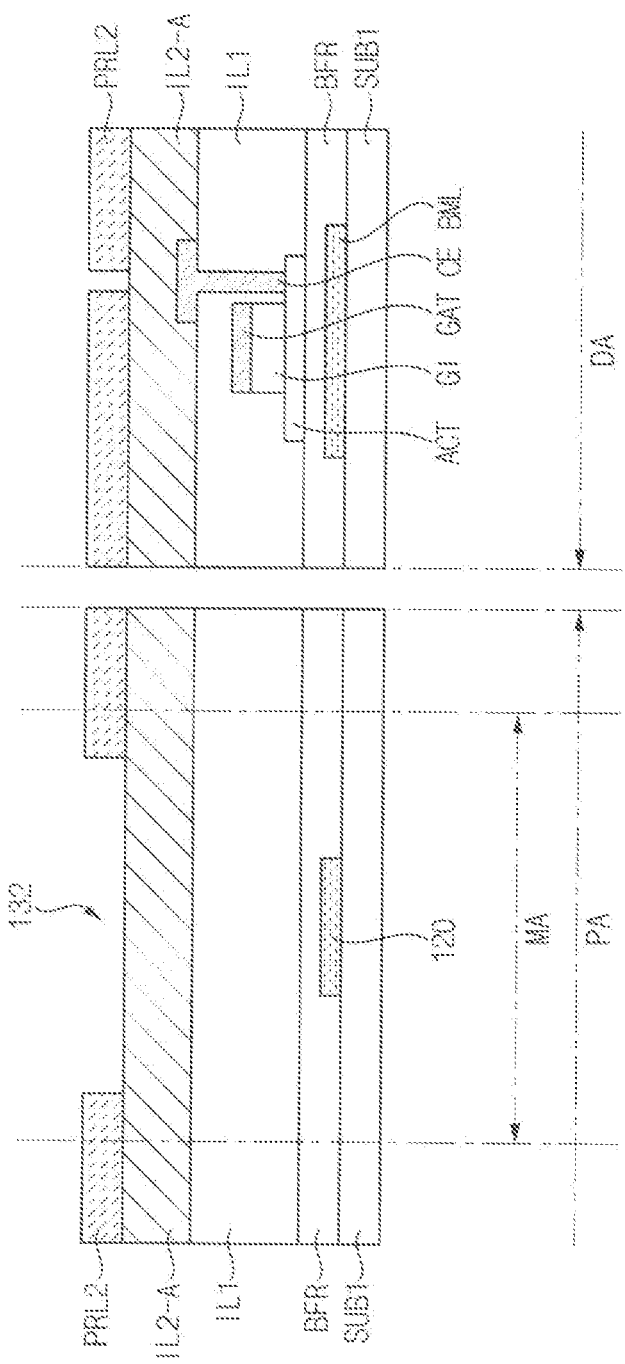
FIGS. 21 and 22 are schematic cross-sectional views illustrating a method of manufacturing a display device according to another embodiment.
Figure 22:
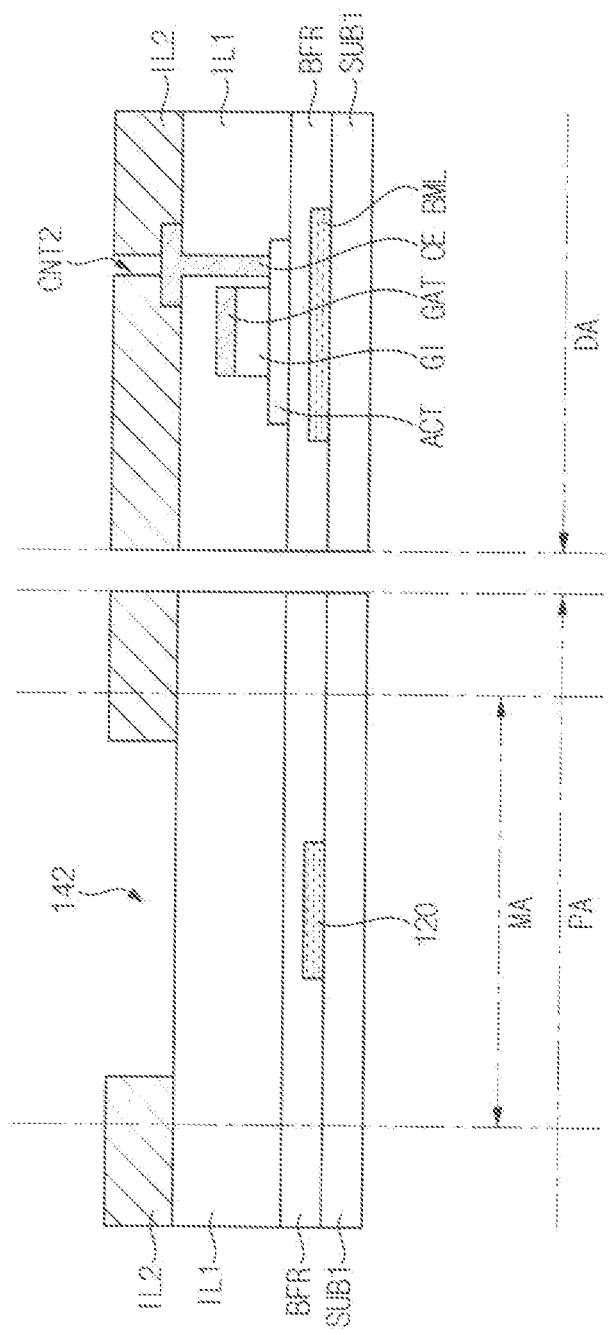

FIGS. 21 and 22 are schematic cross-sectional views illustrating a method of manufacturing a display device according to another embodiment. For example, each of FIGS. 21 and 22 may correspond to the cross-sectional views of FIGS. 13 and 17, respectively.

Referring to FIGS. 21 and 22, a method of manufacturing a display device 10-1 according to another embodiment may be substantially the same as the method of manufacturing the display device 10 described above with reference to FIGS. 8 to 20, except for a second inspection resist pattern 132 and a second opening pattern 142.

In an embodiment, in the step of forming the second insulating layer IL2 on the first insulating layer IL1, after forming the second material layer IL2-A on the first insulating layer IL1, and forming the second photoresist layer PRL2 on the second material layer IL2-A, an exposure and development process which may be substantially the same as the exposure and development process in the step of forming the first insulating layer IL1 may be performed. Accordingly, in case that the second photoresist layer PRL2 is developed, at least one second inspection resist pattern 132 may be formed. The second inspection resist patterns 132 may be defined at the same level as the second photoresist layer PRL2.

In an embodiment, the second material layer IL2-A may include an inorganic insulating material. Examples of the inorganic insulating material that can be used as the second material layer IL2-A may include silicon oxide, silicon nitride, silicon oxynitride, and the like. These may be used alone or in combination with each other.

In an embodiment, the second inspection resist pattern 132 may have substantially the same planar shape as the first inspection resist pattern 131.

In an embodiment, it may be determined whether the exposure mask 1000 has an alignment error from the second inspection resist pattern 132. A method of determining whether an alignment error of the exposure mask 1000 from the second inspection resist pattern 132 may be substantially the same as a method of determining whether an alignment error of the exposure mask 1000 from the first inspection resist pattern 131. For example, in case that the reference pattern 120 is not positioned at the center of the second inspection resist pattern 132, it may be determined that an alignment error has occurred between the first substrate SUB1 and the exposure mask 1000.

In case that it is determined that there is an alignment error of the exposure mask 1000, all of the second photoresist layer PRL2 may be removed. Thereafter, the second photoresist layer PRL2 may be formed again on the second material layer IL2-A, and the above-described exposure and development processes may be repeated.

In an embodiment, in case that the first opening pattern 141 of FIG. 20 is defined in the first insulating layer IL1, the second inspection resist pattern 132 may be spaced apart from the first opening pattern 141 in plan view. Accordingly, in the process of determining whether the exposure mask 1000 has an alignment error from the second inspection resist pattern 132, interference of the first opening pattern 141 may be minimized or prevented. Accordingly, it may be possible to more accurately determine whether the exposure mask 1000 has an alignment error.

In case that it is determined that there is no alignment error of the exposure mask 1000, the second contact hole CNT2 may be formed in the second material layer IL2-A using the second photoresist layer PRL2 as a mask. After the second contact hole CNT2 is formed, the second photoresist layer PRL2 may be removed to form the second insulating layer IL2 in which the second contact hole CNT2 is defined. In an embodiment, the second contact hole CNT2 may be positioned in the display area DA of the first substrate SUB1.

In an embodiment, as described above, the second insulating layer IL2 may correspond to the passivation layer PVX of FIG. 2. The second insulating layer IL2 may be formed of an inorganic insulating material. Examples of the inorganic insulating material that can be used as the second insulating layer IL2 may include silicon oxide, silicon nitride, silicon oxynitride, and the like. These may be used alone or in combination with each other.

In an embodiment, in case that the second contact hole CNT2 is formed, the second material layer IL2-A exposed by the second inspection resist pattern 132 may be etched together. Accordingly, at least one second opening pattern 142 may be defined in the second insulating layer IL2. In an embodiment, the second opening pattern 142 may have substantially the same planar shape as the first opening pattern 141.

Figure 23:
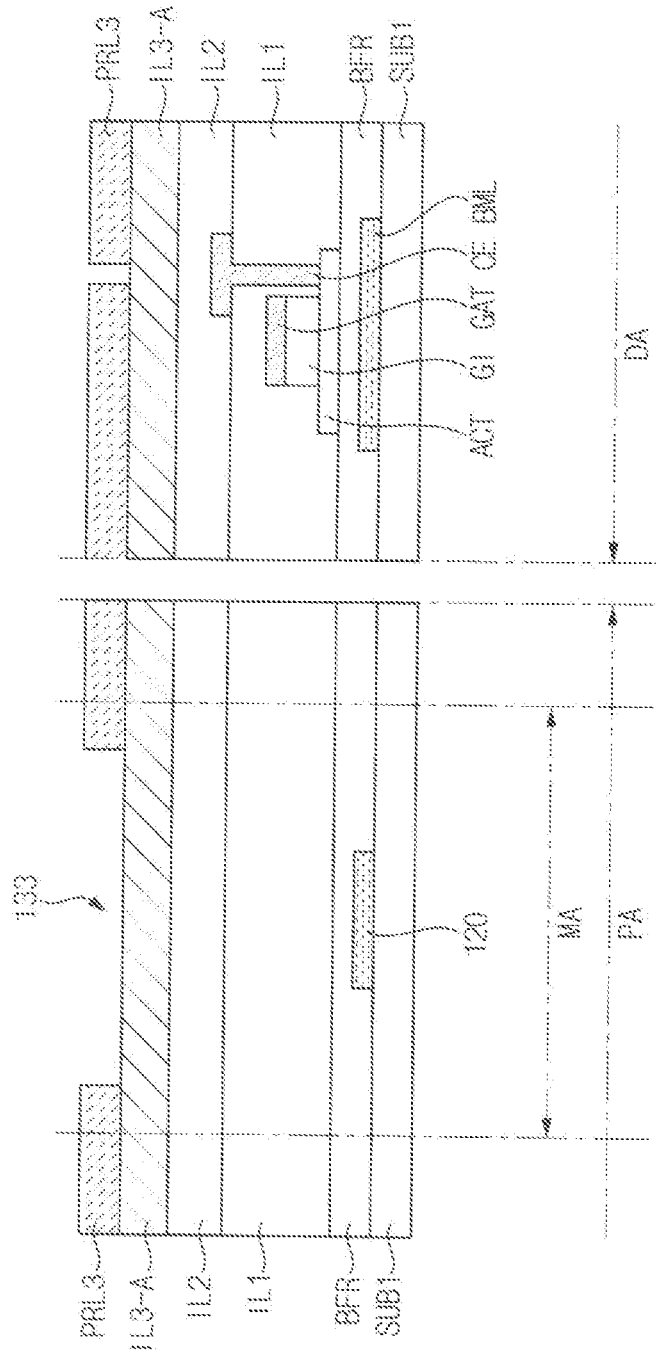
FIGS. 23 and 24 are schematic cross-sectional views illustrating a method of manufacturing a display device according to still other embodiments.
Figure 24:
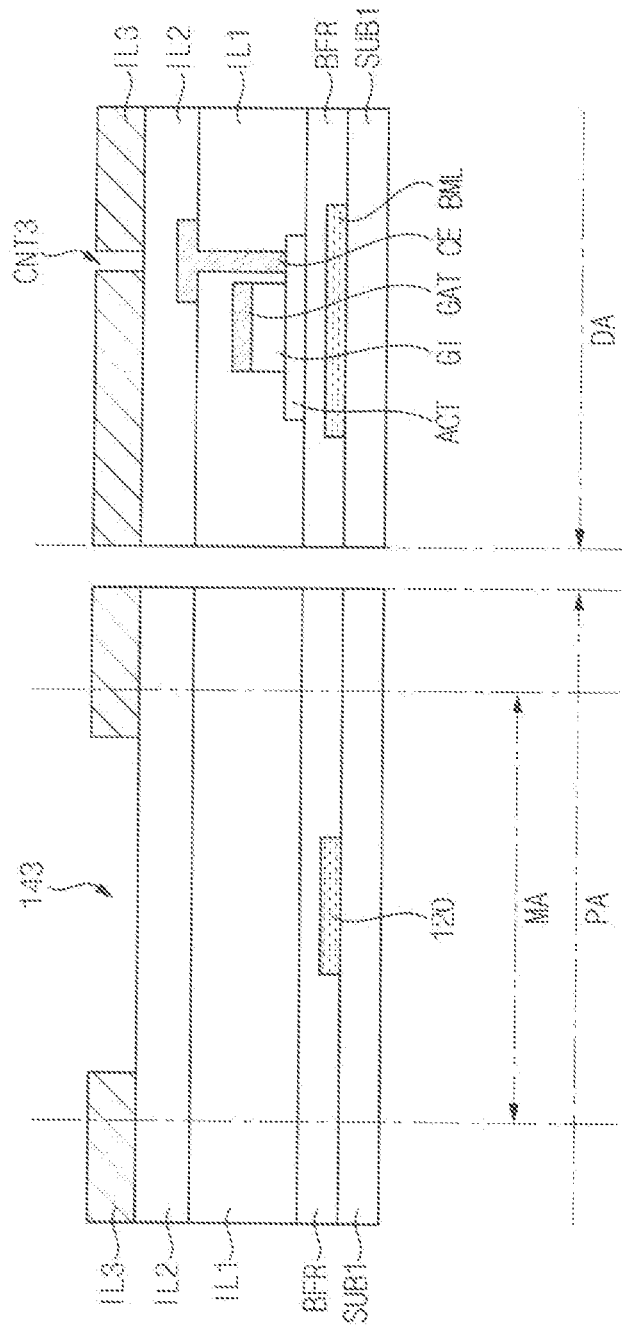

FIGS. 23 and 24 are schematic cross-sectional views illustrating a method of manufacturing a display device according to still other embodiments. For example, each of FIGS. 23 and 24 may correspond to the cross-sectional views of FIGS. 13 and 17, respectively.

Referring to FIGS. 23 and 24, a method of manufacturing a display device 10-2 according to still another embodiment may be substantially the same as the method of manufacturing the display device 10 described above with reference to FIGS. 8 to 20, except for a third inspection resist pattern 133 and a third opening pattern 143.

In an embodiment, in the step of forming the third insulating layer IL3 on the second insulating layer IL2, after forming the third material layer IL3-A on the second insulating layer IL2, and forming the third photoresist layer PRL3 on the third material layer IL3-A, an exposure and development process which may be substantially the same as the exposure and development process in the step of forming the first insulating layer IL1 may be performed. Accordingly, in case that the third photoresist layer PRL3 is developed, at least one third inspection resist pattern 133 may be formed. The third inspection resist patterns 133 may be defined at the same level as the third photoresist layer PRL3.

In an embodiment, the third material layer IL3-A may include an organic insulating material. Examples of the organic insulating material that can be used as the third material layer IL3-A may include polyacrylic resins, polyimide-based resins, acrylic resins, and the like. These may be used alone or in combination with each other.

In an embodiment, the third inspection resist pattern 133 may have substantially the same planar shape as the first inspection resist pattern 131.

In an embodiment, it may be determined whether the exposure mask 1000 has an alignment error from the third inspection resist pattern 133. A method of determining whether an alignment error of the exposure mask 1000 from the third inspection resist pattern 133 may be substantially the same as a method of determining whether an alignment error of the exposure mask 1000 from the first inspection resist pattern 131. For example, in case that the reference pattern 120 is not positioned at the center of the third inspection resist pattern 133, it may be determined that an alignment error has occurred between the first substrate SUB1 and the exposure mask 1000.

In case that it is determined that there is an alignment error of the exposure mask 1000, all of the third photoresist layer PRL3 may be removed. Thereafter, the third photoresist layer PRL3 may be formed again on the third material layer IL3-A, and the above-described exposure and development processes may be repeated.

In an embodiment, in case that the first opening pattern 141 of FIG. 20 is defined in the first insulating layer IL1 and/or the second opening pattern 142 of FIG. 22 is defined in the second insulating layer IL2, the third inspection resist pattern 133 may be spaced apart from the first opening pattern 141 and/or the second opening pattern 142 in plan view. Accordingly, in the process of determining whether the exposure mask 1000 has an alignment error from the third inspection resist pattern 133, interference of the first opening pattern 141 and/or the second opening pattern 142 may be minimized or prevented. Accordingly, it may be possible to more accurately determine whether the exposure mask 1000 has an alignment error.

In case that it is determined that there is no alignment error of the exposure mask 1000, the third contact hole CNT3 may be formed in the third material layer IL3-A using the third photoresist layer PRL3 as a mask. After the third contact hole CNT3 is formed, the third photoresist layer PRL3 may be removed to form the third insulating layer IL3 in which the third contact hole CNT3 is defined. In an embodiment, the third contact hole CNT3 may be positioned in the display area DA of the first substrate SUB1.

In an embodiment, as described above, the third insulating layer IL3 may correspond to the via insulating layer VIA of FIG. 2. The third insulating layer IL3 may be formed of an organic insulating material. Examples of the organic insulating material that can be used as the third material layer IL3-A may include polyacrylic resins, polyimide-based resins, acrylic resins, and the like. These may be used alone or in combination with each other.

In an embodiment, in case that the third contact hole CNT3 is formed, the third material layer IL3-A exposed by the third inspection resist pattern 133 may be etched together. Accordingly, at least one third opening pattern 143 may be defined in the third insulating layer IL3. In an embodiment, the third opening pattern 143 may have substantially the same planar shape as the first opening pattern 141.

Figure 25:
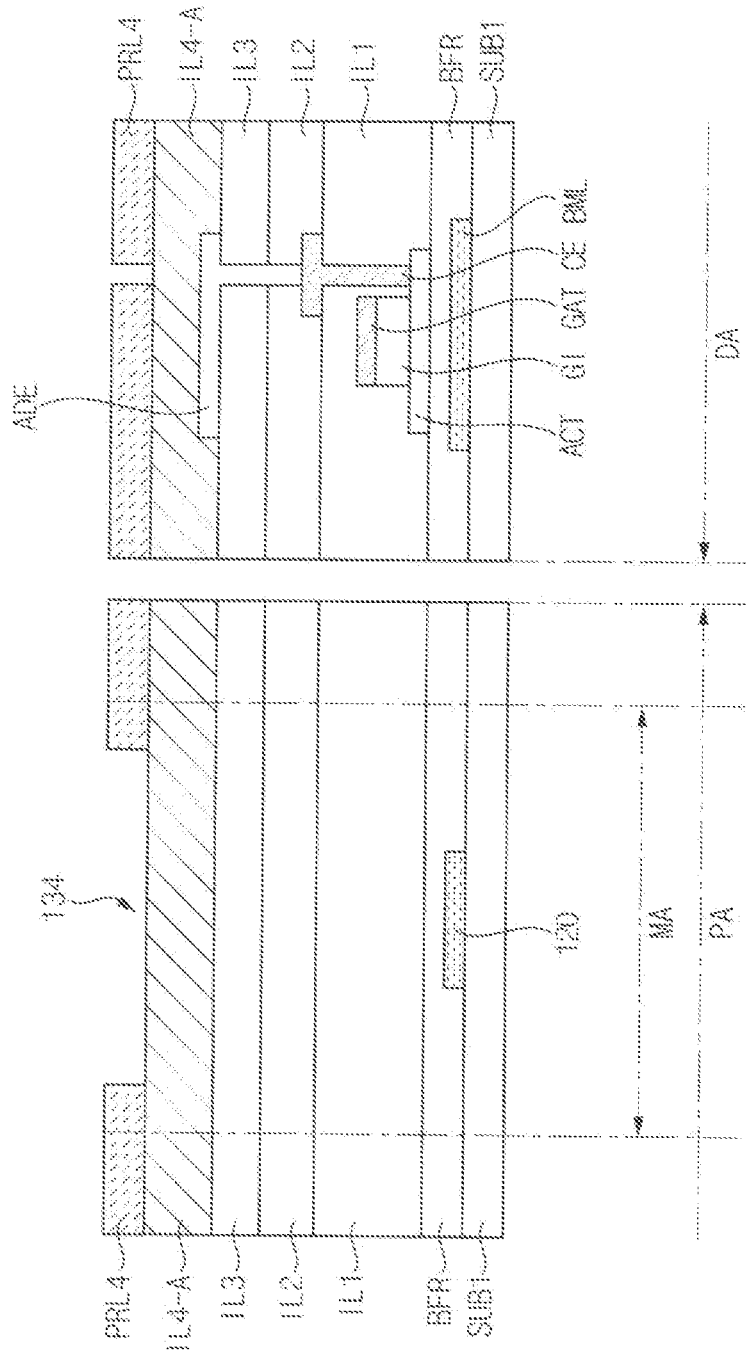
FIGS. 25 and 26 are schematic cross-sectional views illustrating a method of manufacturing a display device according to still other embodiments.
Figure 26:
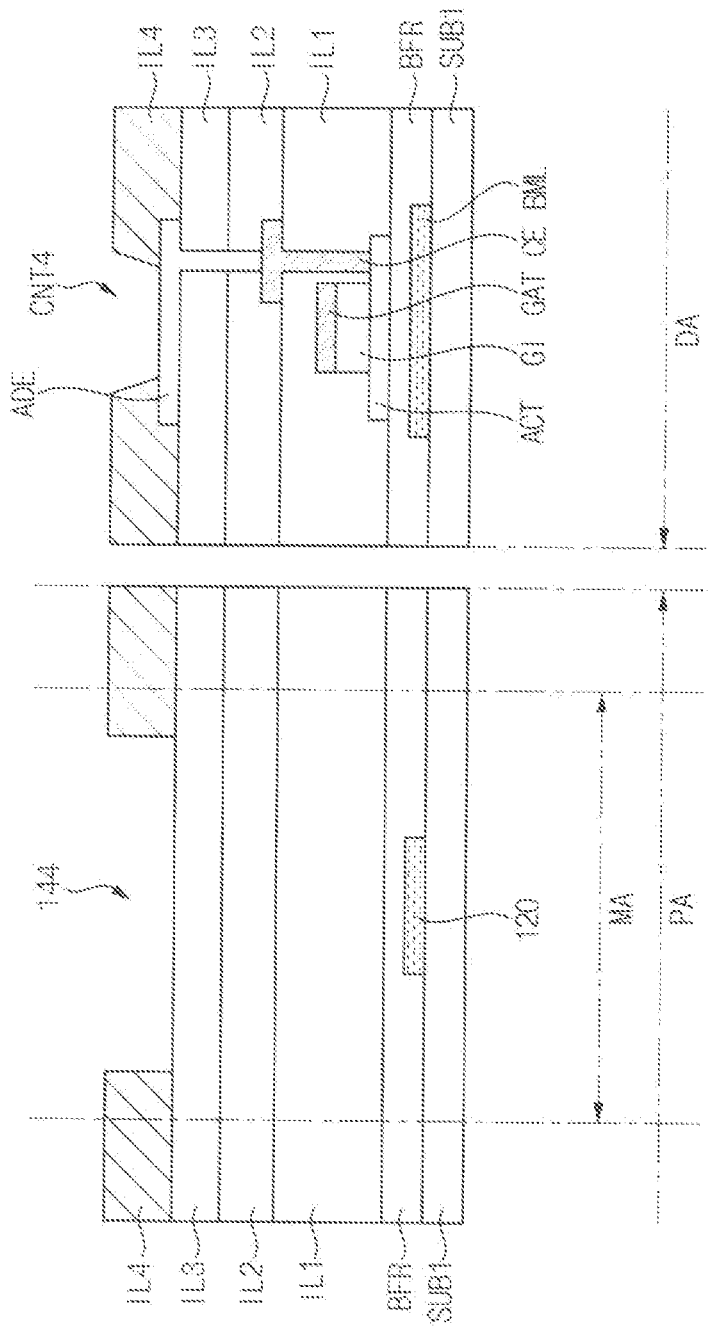

FIGS. 25 and 26 are schematic cross-sectional views illustrating a method of manufacturing a display device according to still other embodiments. For example, each of FIGS. 25 and 26 may correspond to the cross-sectional views of FIGS. 13 and 17, respectively.

Referring to FIGS. 25 and 26, a method of manufacturing a display device 10-3 according to still another embodiment may be substantially the same as the method of manufacturing the display device 10 described above with reference to FIGS. 8 to 20, except for a fourth inspection resist pattern 134 and a fourth opening pattern 144.

In an embodiment, in the step of forming the fourth insulating layer IL4 on the third insulating layer IL3, after forming the fourth material layer IL4-A on the third insulating layer IL3, and forming the fourth photoresist layer PRL4 on the fourth material layer IL4-A, an exposure and development process which may be substantially the same as the exposure and development process in the step of forming the first insulating layer IL1 may be performed. Accordingly, in case that the fourth photoresist layer PRL4 is developed, at least one fourth inspection resist pattern 134 may be formed. The fourth inspection resist patterns 134 may be defined at the same level as the fourth photoresist layer PRL4.

In an embodiment, the fourth material layer IL4-A may include an organic insulating material. Examples of the organic insulating material that can be used as the fourth material layer IL4-A may include polyacrylic resins, polyimide-based resins, acrylic resins, and the like. These may be used alone or in combination with each other.

In an embodiment, the fourth inspection resist pattern 134 may have substantially the same planar shape as the first inspection resist pattern 131.

In an embodiment, it may be determined whether the exposure mask 1000 has an alignment error from the fourth inspection resist pattern 134. A method of determining whether an alignment error of the exposure mask 1000 from the fourth inspection resist pattern 134 may be substantially the same as a method of determining whether an alignment error of the exposure mask 1000 from the first inspection resist pattern 131. For example, in case that the reference pattern 120 is not positioned at the center of the fourth inspection resist pattern 134, it may be determined that an alignment error has occurred between the first substrate SUB1 and the exposure mask 1000.

In case that it is determined that there is an alignment error of the exposure mask 1000, all of the fourth photoresist layer PRL4 may be removed. Thereafter, the fourth photoresist layer PRL4 may be formed again on the fourth material layer IL4-A, and the above-described exposure and development processes may be repeated.

In an embodiment, in case that the first opening pattern 141 of FIG. 20 is defined in the first insulating layer IL1, the second opening pattern 142 of FIG. 22 is defined in the second insulating layer IL2, and/or the third opening pattern 143 of FIG. 24 is defined in the third insulating layer IL3, the fourth inspection resist pattern 134 may be spaced apart from the first opening pattern 141, the second opening pattern 142, and/or the third opening pattern 143 in plan view. Accordingly, in the process of determining whether the exposure mask 1000 has an alignment error from the fourth inspection resist pattern 134, interference of the first opening pattern 141, the second opening pattern 142, and/or the third opening pattern 143 may be minimized or prevented.

Accordingly, it may be possible to more accurately determine whether the exposure mask 1000 has an alignment error.

In case that it is determined that there is no alignment error of the exposure mask 1000, the fourth contact hole CNT4 may be formed in the fourth material layer IL4-A using the fourth photoresist layer PRL4 as a mask. After the fourth contact hole CNT4 is formed, the fourth photoresist layer PRL4 may be removed to form the fourth insulating layer IL4 in which the fourth contact hole CNT4 is defined. In an embodiment, the fourth contact hole CNT4 may be positioned in the display area DA of the first substrate SUB1.

In an embodiment, as described above, the fourth insulating layer IL4 may correspond to the pixel defining layer PDL of FIG. 2. The fourth insulating layer IL4 may be formed of an organic insulating material. Examples of the organic insulating material that can be used as the fourth insulating layer IL4 may include polyacrylic resins, polyimide-based resins, acrylic resins, and the like. These may be used alone or in combination with each other.

In an embodiment, in case that the fourth contact hole CNT4 is formed, the fourth material layer IL4-A exposed by the fourth inspection resist pattern 134 may be etched together. Accordingly, at least one fourth opening pattern 144 may be defined in the fourth insulating layer IL4. In an embodiment, the fourth opening pattern 144 may have substantially the same planar shape as the first opening pattern 141.

According to embodiments, an inspection resist pattern may be formed in each exposure and development process for forming each of the first to fourth insulating layers IL1, IL2, IL3, and IL4. Accordingly, in the exposure process for forming each of the first to fourth insulating layers IL1, IL2, IL3, and IL4, it may be possible to individually determine whether the exposure mask 1000 has an alignment error. Accordingly, it may be possible to more readily determine whether the exposure mask 1000 has an alignment error.

Figure 27:
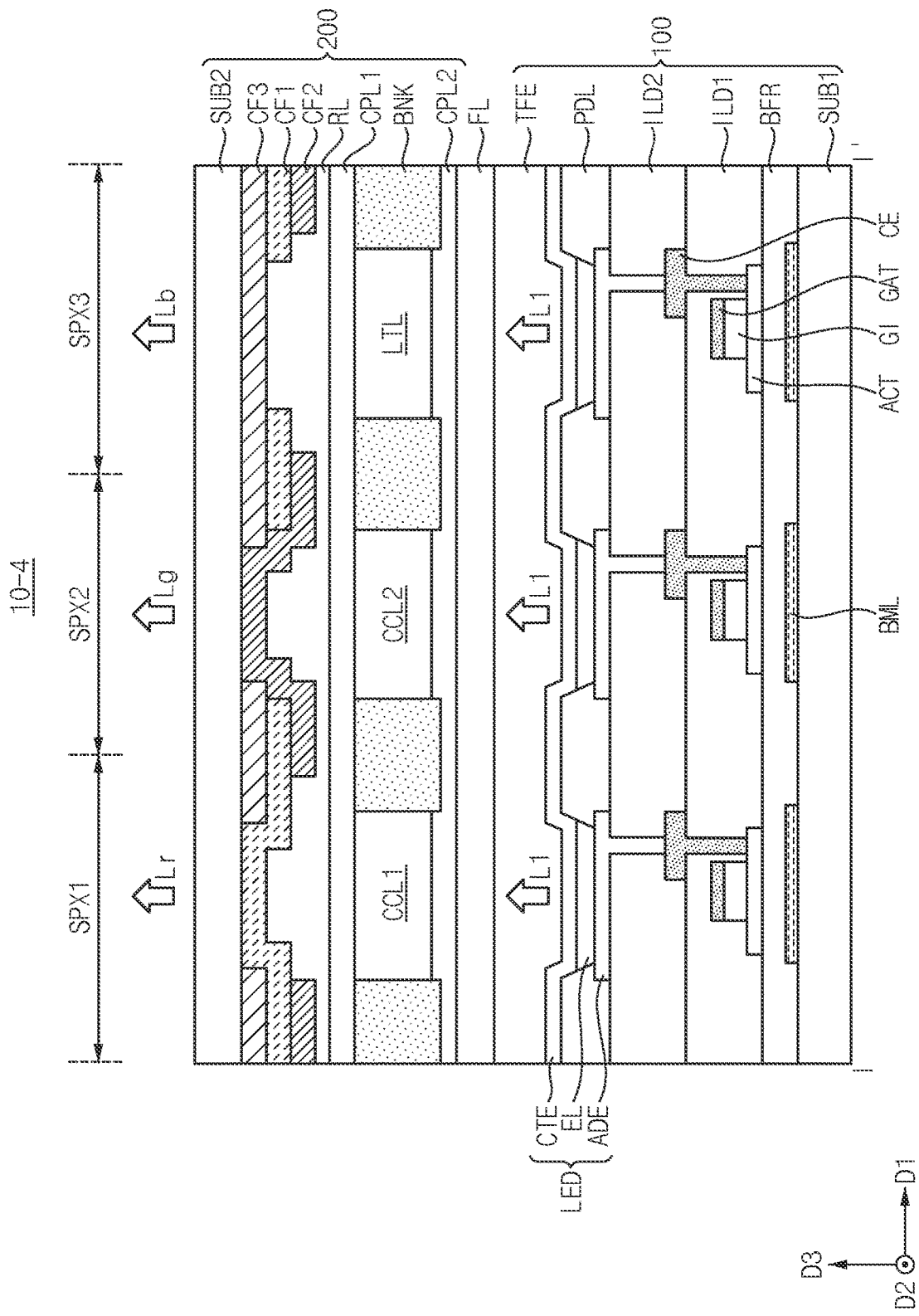
FIG. 27 is a schematic cross-sectional view illustrating a display device according to still another embodiment.

FIG. 27 is a schematic cross-sectional view illustrating a display device according to still another embodiment. For example, FIG. 27 may correspond to the cross-sectional view of FIG. 2.

Referring to FIG. 27, a display device 10-4 according to still another embodiment may be substantially the same as the display device 10 described above with reference to FIG. 2, except that the second interlayer insulating layer ILD2 may be a single layer. In an embodiment, the second interlayer insulating layer ILD2 may be a single layer. In other words, in the manufacturing process of the display device 10-4, the second insulating layer IL2 of FIG. 20 corresponding to the passivation layer PVX of FIG. 2 and the third insulating layer IL2 of FIG. 20 corresponding to the via insulating layer VIA of FIG. 2 may be formed by being integrated into a single layer through a single process.

For example, after forming a single material layer on the first insulating layer IL1 and forming a photoresist layer on the material layer, an exposure and development process which may be substantially the same as the exposure and development process in the step of forming the first insulating layer IL1 may be performed. Accordingly, the efficiency of the display device manufacturing process may be further improved.

Figure 28:
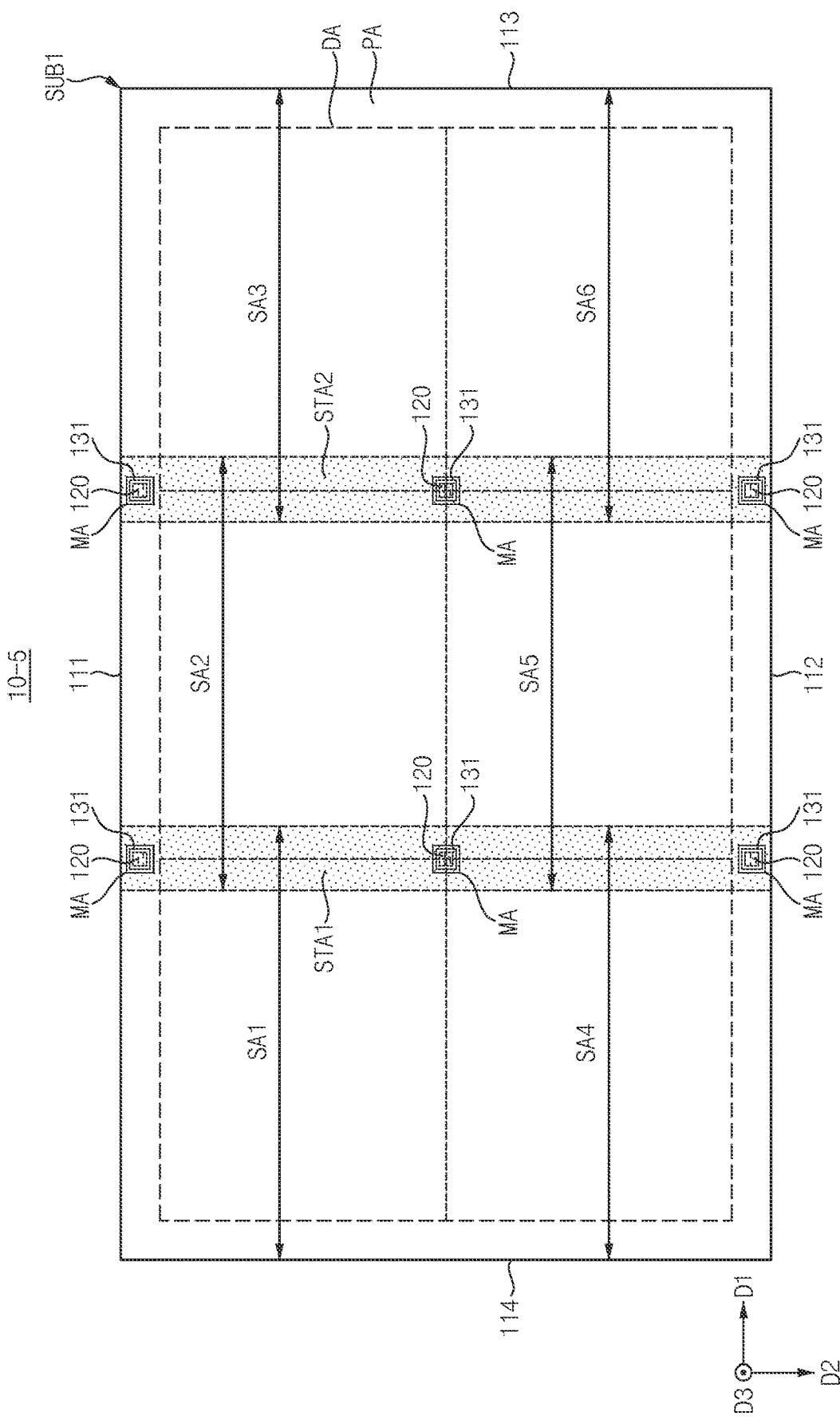
FIG. 28 is a schematic plan view illustrating a display device according to still another embodiment.

FIG. 28 is a schematic plan view illustrating a display device according to still another embodiment. For example, FIG. 28 may correspond to the plan view of FIG. 3.

Referring to FIG. 28, the display device 10-5 according to still another embodiment may be substantially the same as the display device 10 described above with reference to FIG. 3, except for the positions of the first inspection resist patterns 131.

In an embodiment, at least one of the first inspection resist patterns 131 may be positioned in an area where the first stitch area STA1 and the display area DA of the first substrate SUB1 overlap and an area where the second stitch area STA2 and the display area DA of the first substrate SUB1 overlap.

For example, since the first inspection resist patterns 131 are formed in portions where corners of adjacent shot areas contact each other, in case that the first substrate SUB1 is divided into six shot areas SA1, SA2, SA3, SA4, SA5, and SA6 including two rows and three columns and exposed, at least one of the first inspection resist patterns 131 may be positioned in an area where the first stitch area STA1 and the display area DA of the first substrate SUB1 overlap and an area where the second stitch area STA2 and the display area DA of the first substrate SUB1 overlap.

At least one of the reference patterns 120 may be positioned in an area where the first stitch area STA1 and the display area DA of the first substrate SUB1 overlap and an area where the second stitch area STA2 and the display area DA of the first substrate SUB1 overlap. In other words, at least one of the reference patterns 120 may overlap the first inspection resist pattern 131 positioned in the display area DA in plan view According to embodiments, it may be possible to determine whether the exposure mask 1000 has an alignment error even within the display area DA. Accordingly, it may be possible to more accurately determine whether the exposure mask 1000 has an alignment error.

The disclosure should not be construed as being limited to the embodiments set forth herein. Rather, these embodiments are provided so that this disclosure will be thorough and complete and will fully convey aspects of the disclosure to those skilled in the art.

While the disclosure has been particularly shown and described with reference to embodiments thereof, it will be understood by those of ordinary skill in the art that various changes in form and details may be made therein without departing from the spirit or scope of the disclosure.

What is claimed is:

1. An exposure mask comprising:
   a mask base layer comprising a first area and a second area spaced apart from the first area in a first direction;
   a first inspection transmission pattern formed in the first area of the mask base layer, the first inspection transmission pattern comprising:
   a plurality of optical transmission parts spaced apart and arranged in a ring shape, and
   at least one connection part between the plurality of optical transmission parts in plan view; and
   a second inspection transmission pattern formed in the second area of the mask base layer and arranged in a polygonal shape or a circular shape in plan view,
   wherein the plurality of optical transmission parts are point-symmetric with respect to a central point of the first inspection transmission pattern in plan view.

2. The exposure mask of claim 1, wherein the plurality of optical transmission parts of the first inspection transmission pattern comprise:
   a first optical transmission part;
   a second optical transmission part spaced apart from the first optical transmission part in the first direction; and
   a first connection part between the first optical transmission part and the second optical transmission part.

3. The exposure mask of claim 2, wherein the plurality of optical transmission parts of the first inspection transmission pattern further comprise:
- a third optical transmission part spaced apart from the second optical transmission part in a second direction perpendicular to the first direction; and
- a second connection part between the second optical transmission part and the third optical transmission part.

4. The exposure mask of claim 3, wherein the plurality of optical transmission parts of the first inspection transmission pattern further comprise:
- a fourth optical transmission part spaced apart from the third optical transmission part in a direction opposite to the first direction and spaced apart from the first optical transmission part in the second direction;
- a third connection part between the third optical transmission part and the fourth optical transmission part; and
- a fourth connection part between the first optical transmission part and the fourth optical transmission part.

5. The exposure mask of claim 4, wherein the mask base layer positioned inside of the first inspection transmission pattern is connected to the mask base layer positioned outside of the first inspection transmission pattern by the first to fourth connection parts.

6. The exposure mask of claim 4, wherein
- the first inspection transmission pattern has a rectangular ring shape; and
- the second inspection transmission pattern has a rectangular shape.

7. The exposure mask of claim 6, wherein each of the first to fourth optical transmission parts has a rectangular shape in plan view.

8. The exposure mask of claim 7, wherein the second inspection transmission pattern has a square shape in plan view.

9. The exposure mask of claim 8, wherein in case that the first inspection transmission pattern is moved in the first direction, each of the first to fourth optical transmission parts overlaps a corner of the second inspection transmission pattern.

10. The exposure mask of claim 1, wherein the first to fourth optical transmission parts are sequentially arranged in a clockwise direction with respect to the central point.

* * * * *